(12) United States Patent
Matsuda et al.

(10) Patent No.: US 7,135,665 B2
(45) Date of Patent: Nov. 14, 2006

(54) SOLID-STATE IMAGE SENSING APPARATUS INCLUDING A NOISE SUPPRESSING CIRCUIT

(75) Inventors: Seisuke Matsuda, Hachioji (JP); Yuichi Gomi, Hachioji (JP); Yukihiro Kuroda, Hachioji (JP); Keiichi Mori, Hachioji (JP)

(73) Assignee: Olympus Corporation (JP)

( * ) Notice: Subject to any disclaimer, the term of this patent is extended or adjusted under 35 U.S.C. 154(b) by 110 days.

(21) Appl. No.: 10/809,634

(22) Filed: Mar. 25, 2004

(65) Prior Publication Data
US 2004/0262492 A1    Dec. 30, 2004

(30) Foreign Application Priority Data
Apr. 15, 2003   (JP)   ............... 2003-110436

(51) Int. Cl.
H01L 27/00 (2006.01)
H04N 5/217 (2006.01)

(52) U.S. Cl. ................... 250/208.1; 348/241

(58) Field of Classification Search ............... 348/241, 348/243, 245; 250/208.1
See application file for complete search history.

(56) References Cited

U.S. PATENT DOCUMENTS
4,816,917 A * 3/1989 Yamamoto et al. ......... 348/257
6,788,340 B1 * 9/2004 Chen et al. ............... 348/229.1

FOREIGN PATENT DOCUMENTS
JP       2002-290841       10/2002

* cited by examiner

*Primary Examiner*—Thanh X. Luu
(74) *Attorney, Agent, or Firm*—Straub and Pokotylo; John C. Pokotylo

(57) ABSTRACT

A solid-state image sensing apparatus of an aspect of this invention can appropriately correct the black level of a video signal even when a high-luminance state or spotlight exists. The apparatus includes an effective pixel unit to receive object light, and a light-shielded light-shielded pixel unit to output an optical black level equivalent signal. In addition to the output from the effective pixel unit, one of the output from the light-shielded pixel unit and a predetermined reference voltage is selectively output.

9 Claims, 17 Drawing Sheets

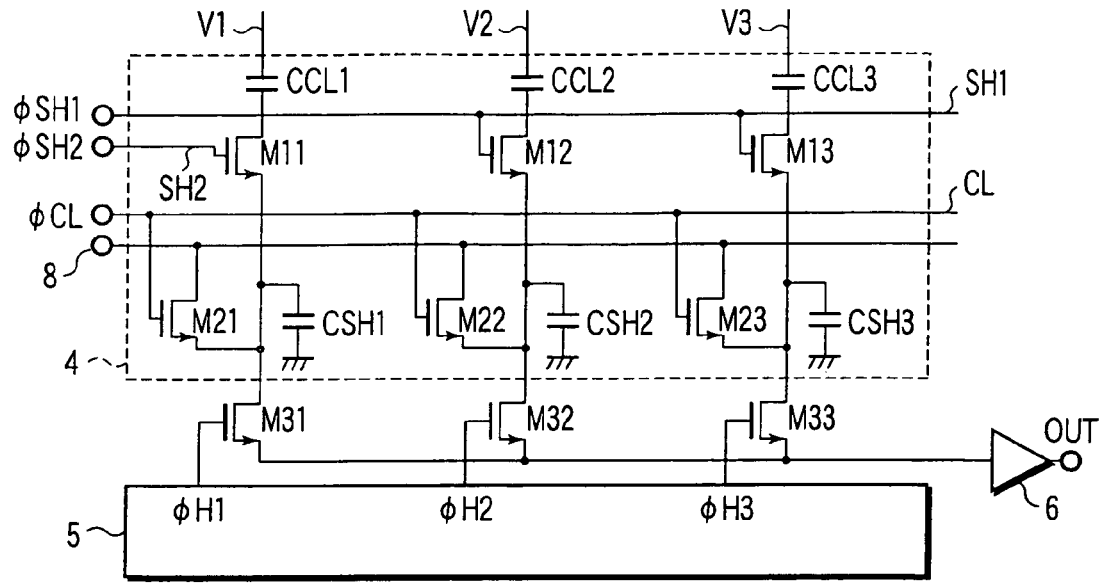
F I G. 5
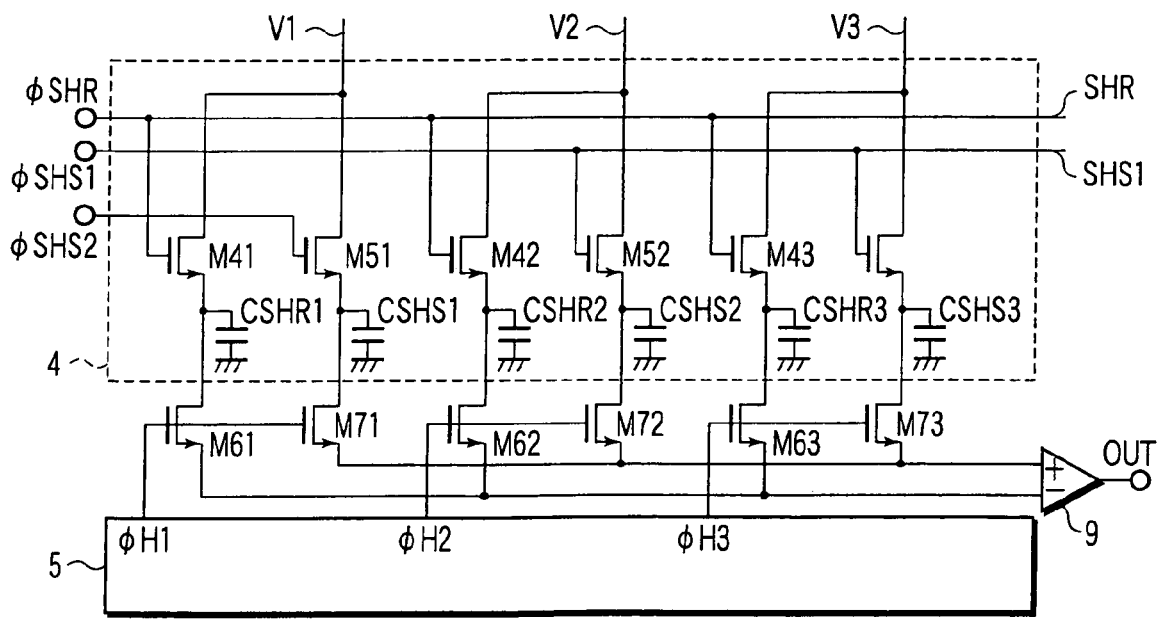
F I G. 7

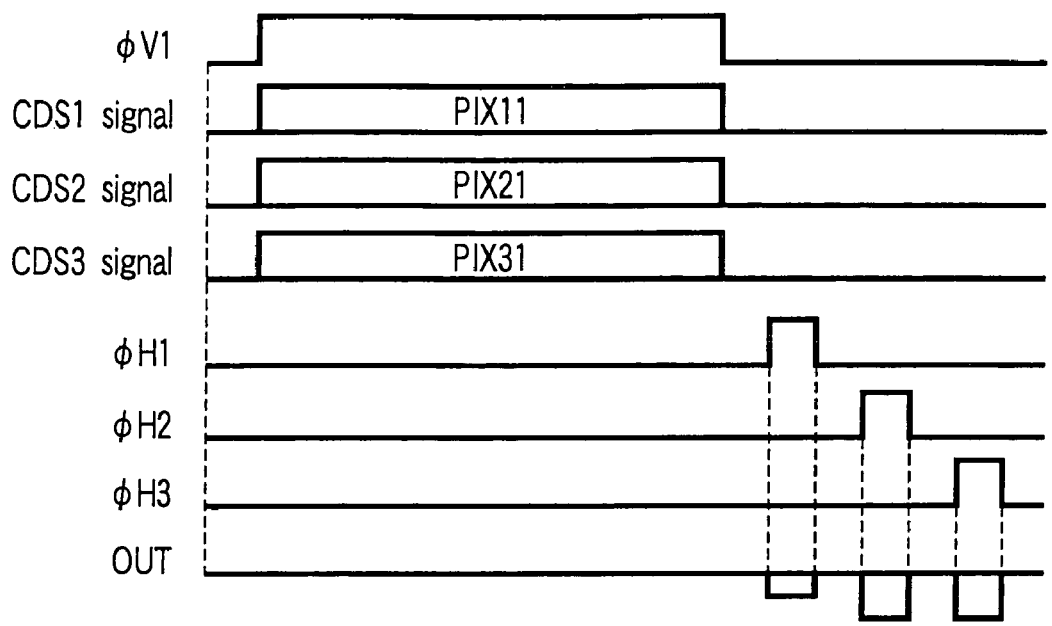
F I G. 13A
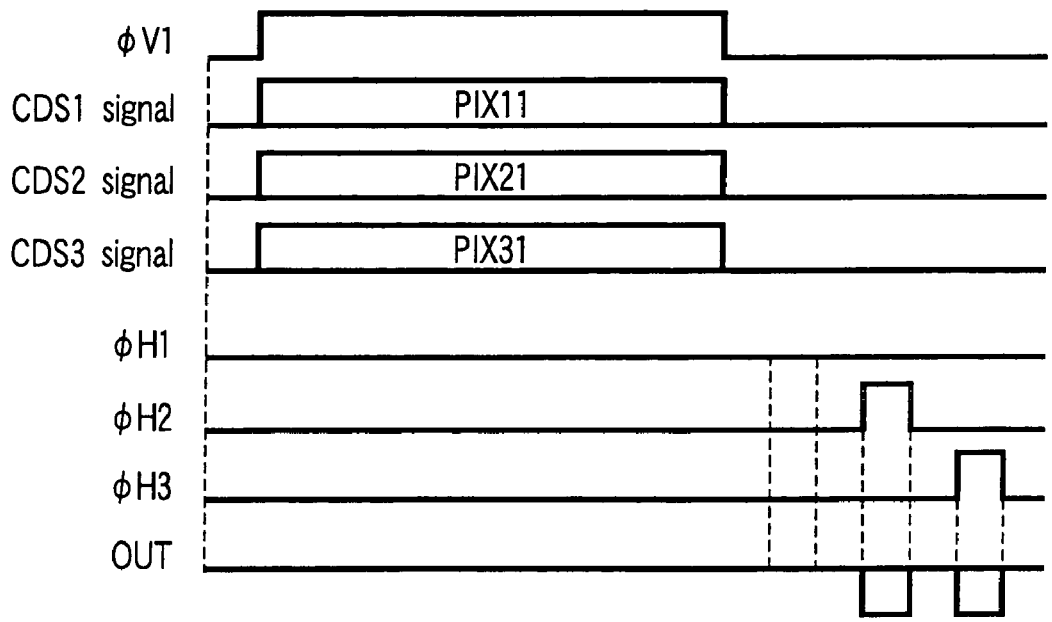
F I G. 13B

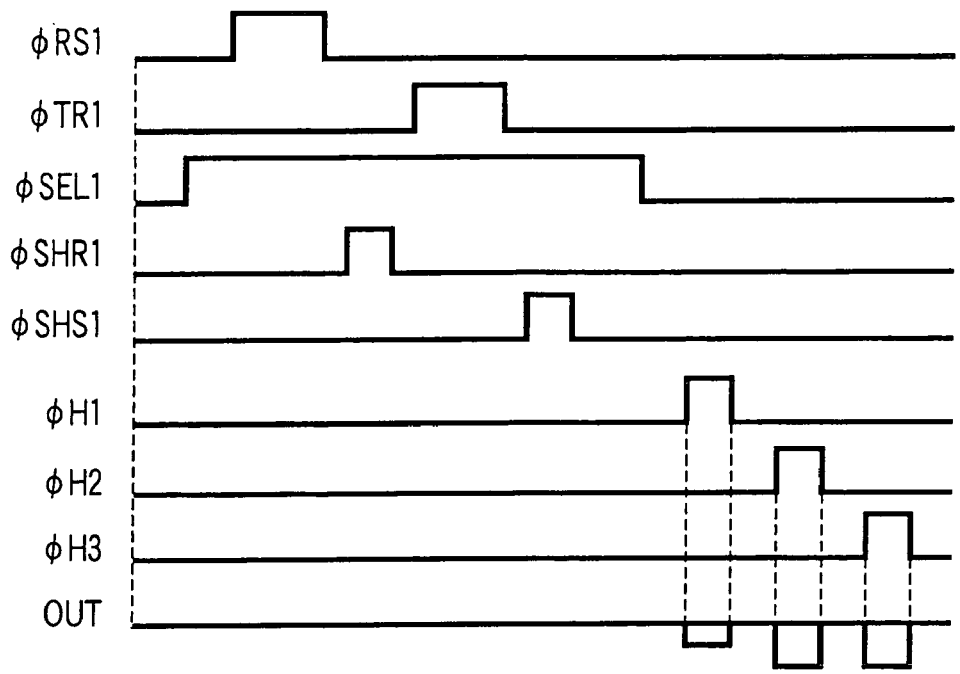
F I G. 15A
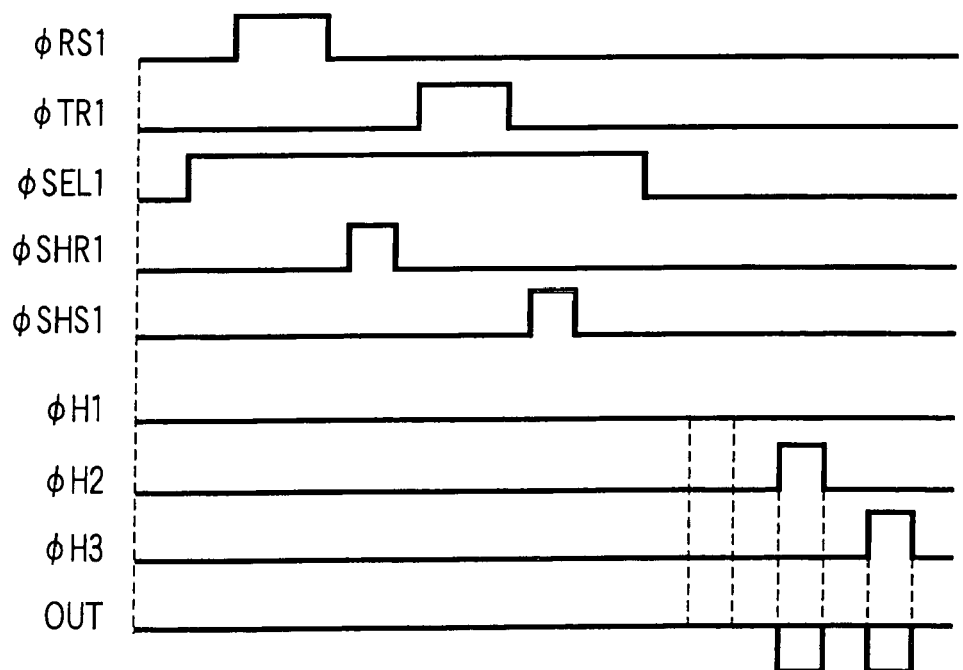
F I G. 15B

SOLID-STATE IMAGE SENSING APPARATUS INCLUDING A NOISE SUPPRESSING CIRCUIT

CROSS-REFERENCE TO RELATED APPLICATIONS

This application is based upon and claims the benefit of priority from the prior Japanese Patent Application No. 2003-110436, filed Apr. 15, 2003, the entire contents of which are incorporated herein by reference.

BACKGROUND OF THE INVENTION

1. Field of the Invention

The present invention relates to a solid-state image sensing apparatus which has, e.g., an effective signal photoelectric conversion unit and a light-shielded reference signal photoelectric conversion unit to output a black level equivalent signal, and corrects the signal output level of the effective signal photoelectric conversion unit on the basis of the output signal from the reference signal photoelectric conversion unit.

2. Description of the Related Art

Conventionally, in image sensing using a solid-state image sensing apparatus, the pixel output variation at the time of reset must be corrected. To do this, correlated double sampling (CDS) is executed. In addition, to make the black level of a video signal constant, an error signal (dark current component) generated by a dark current must be subtracted from the video signal. To detect the dark current component, the output signal from a light-shielded pixel (optical black [OB] signal) is referred to.

However, in sensing a scene having extremely high luminance as a whole or a scene containing a high-luminance light source such as a spotlight, the OB signal level may vary. If black level correction is done by using the varying OB signal, the video signal may be inappropriate. There is a conventional technique-related to an image sensing apparatus (Jpn. Pat. Appln. KOKAI Publication No. 2002-290841). In this prior art, OB regions are prepared at a plurality of points near the effective pixel region including light-receiving elements which are arrayed on the light-receiving surface and generate pixel signals. Pixel signals are read out from both regions, thereby preventing any partial decrease in level of the pixel signals after black level correction.

Patent reference 1 above discloses several techniques for coping with the above-described situation, though none of them can solve the problem practically.

BRIEF SUMMARY OF THE INVENTION

The present invention has been made in consideration of the above technical problem, and has as its object to provide a solid-state image sensing apparatus which can appropriately correct the black level of a video signal even when a high-luminance state or spotlight exists.

In order to achieve the above object, according to an aspect of the present invention, there is provided a solid-state image sensing apparatus comprising an effective signal photoelectric conversion unit to receive object light, and a light-shielded reference signal photoelectric conversion unit to output an optical black level equivalent signal, wherein in addition to an output from the effective signal photoelectric conversion unit, one of an output from the reference signal photoelectric conversion unit and a predetermined reference voltage is selectively output.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view showing the arrangement of a solid-state image sensing apparatus according to the third embodiment of the present invention;

FIG. 7 is a view showing the arrangement of a solid-state image sensing apparatus according to the fourth embodiment of the present invention;

FIG. 13A is a timing chart of a read operation for an output signal from a light-shielded pixel unit 1, which is used when the incident light amount is small, in the solid-state image sensing apparatus according to the seventh embodiment;

FIG. 13B is a timing chart of a read operation for a reference signal different from the output signal from the light-shielded pixel unit 1, which is used when very strong light is incident, in the solid-state image sensing apparatus according to the seventh embodiment;

FIG. 15A is a timing chart of a read operation for an output signal from a light-shielded pixel unit 1, which is used when the incident light amount is small, in the solid-state image sensing apparatus according to the ninth embodiment;

FIG. 15B is a timing chart of a read operation for a reference signal different from the output signal from the light-shielded pixel unit 1, which is used when very strong light is incident, in the solid-state image sensing apparatus according to the ninth embodiment;

DETAILED DESCRIPTION OF THE INVENTION

The embodiments of the present invention will be described below with reference to the accompanying drawing.

In a solid-state image sensing apparatus according to an embodiment of the present invention, to process CDS and black clamp, a pixel signal or a reference signal (reference voltage) from light-shielded pixels in a reference signal photoelectric conversion unit (light-shielded pixel unit) can be selectively output. Under a high-luminance condition, a reference level signal is output in place of a pixel signal from the light-shielded pixels. Each embodiment will be described below in detail based on the above-described characteristic feature.

(First Embodiment)

Figure 1:
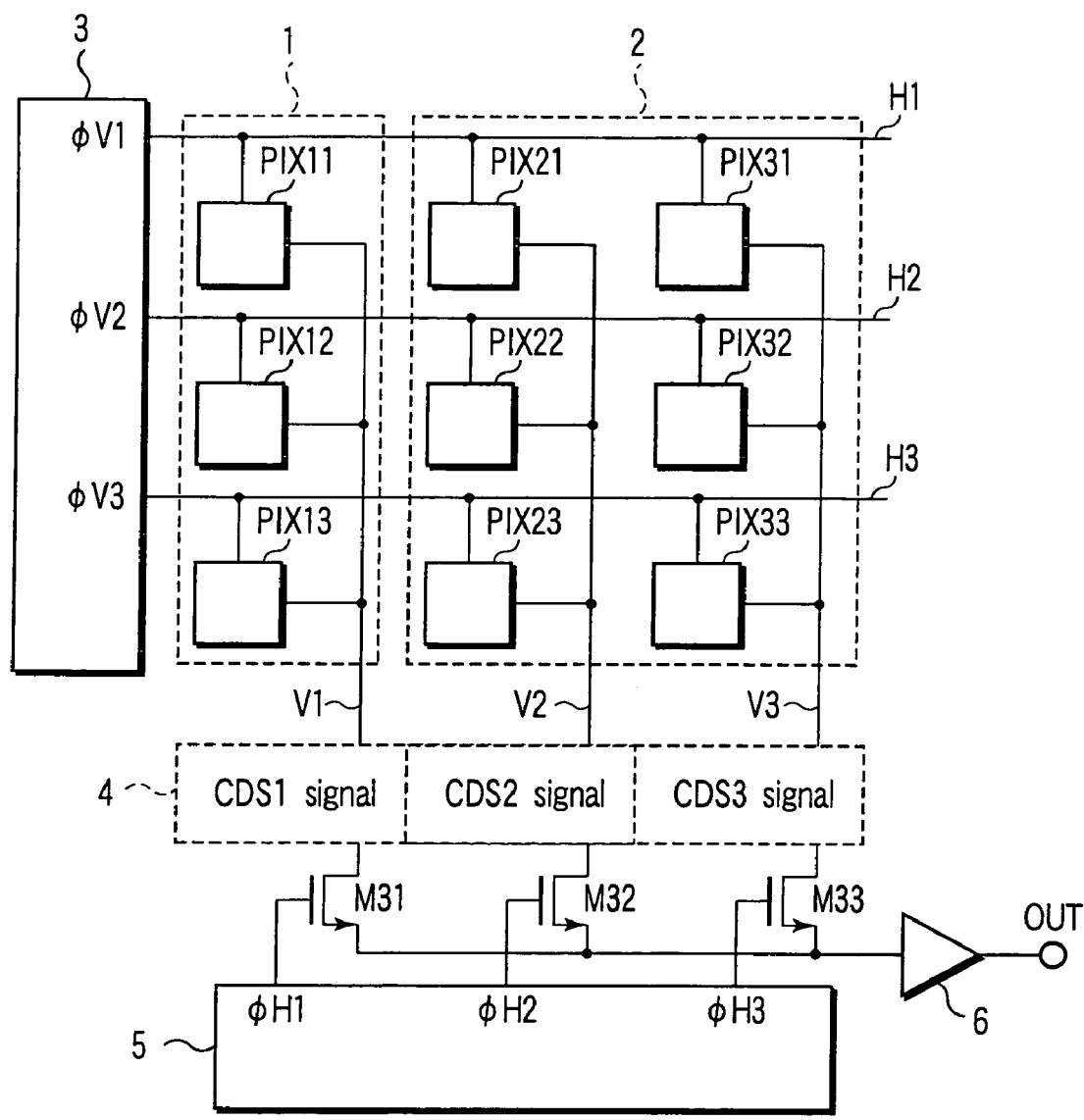
FIG. 1 is a view showing the arrangement of a solid-state image sensing apparatus according to the first embodiment of the present invention.

FIG. 1 shows the arrangement of a solid-state image sensing apparatus according to the first embodiment of the present invention. This will be described.

Referring to FIG. 1, reference symbols PIX11 to PIX33 denote pixels arrayed in a matrix. Of the pixels PIX11 to PIX33, the pixels PIX11 to PIX13 form a light-shielded pixel unit 1. The pixels PIX21 to PIX23 and PIX31 to PIX33 form an effective pixel unit 2. The surfaces of the pixels in the light-shielded pixel unit 1 are covered with a light-shielding film such as an aluminum film.

The light-shielded pixel unit 1 functions as a unit which outputs a signal corresponding to the black level. The effective pixel unit 2 functions as a unit which receives object light and generates charges.

A vertical scanning circuit 3 sequentially scans row lines H1 to H3 to sequentially read out pixel signals from the light-shielded pixel unit 1 and effective pixel unit 2. Reference symbols $\phi V1$ to $\phi V3$ in the vertical scanning circuit 3 denote row select signals. A noise suppressing circuit 4 suppresses noise components in pixel signals sent from the light-shielded pixel unit 1 and effective pixel unit 2 through vertical signal lines V1 to V3.

Transistors M31 to M33 indicate horizontal select switches to select and read out pixel signals from the noise suppressing circuit 4 (these transistors will be referred to as "horizontal select switches" hereinafter). The gates of the horizontal select switches M31 to M33 are connected to the output terminals of a horizontal scanning circuit 5 for column select signals $\phi H1$ to $\phi H3$.

The horizontal scanning circuit 5 sequentially drives the horizontal select switches M31 to M33. Reference symbols $\phi H1$ to $\phi H3$ in the horizontal scanning circuit 5 denote column select signals. An output amplifier 6 amplifies the output signal from the noise suppressing circuit 4, which is sent through the horizontal select switches M31 to M33. Although lines other than the row lines H1 to H3 and vertical signal lines V1 to V3 are also connected to the pixels PIX11 to PIX33, for descriptive convenience, they are not illustrated.

Figure 2A:
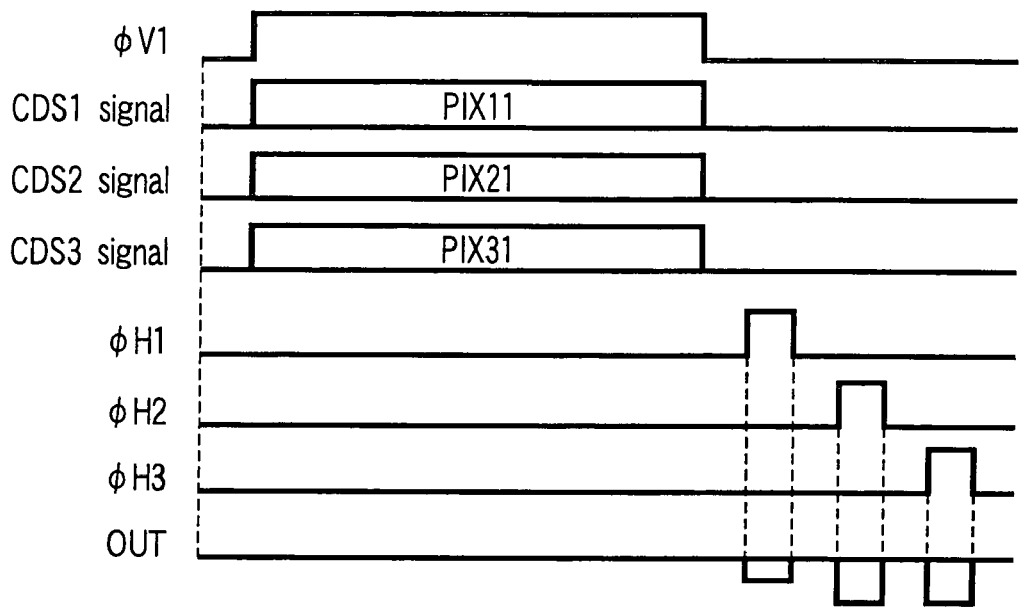
FIG. 2A is a timing chart of a read operation for an output signal from a light-shielded pixel unit 1, which is used when the incident light amount is small, in the solid-state image sensing apparatus according to the first embodiment.
Figure 2B:
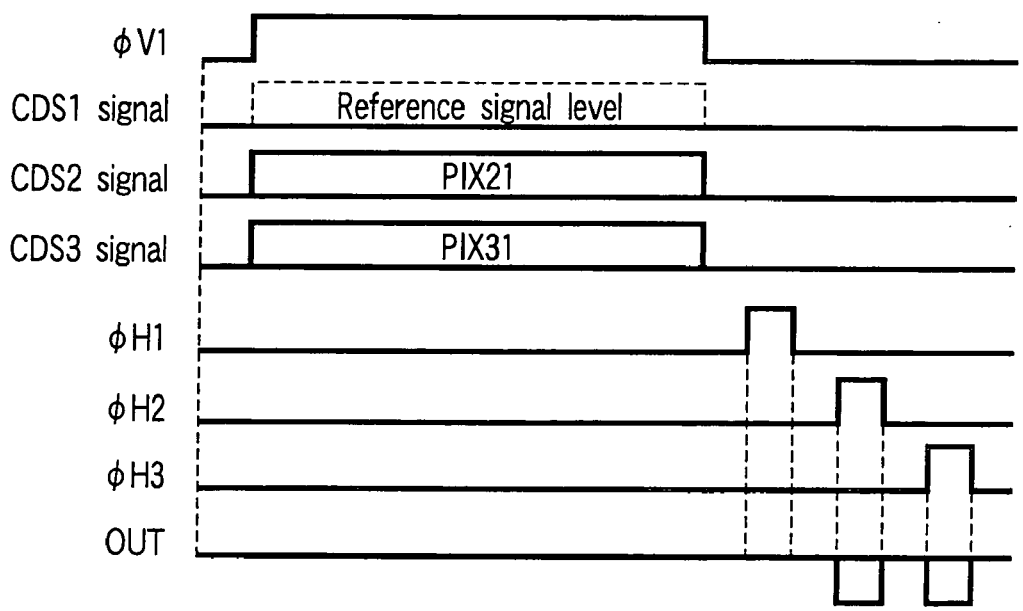
FIG. 2B is a timing chart of a read operation for a reference signal different from the output signal from the light-shielded pixel unit 1, which is used when-very strong light is incident, in the solid-state image sensing apparatus according to the first embodiment.

The output signal read operation of the solid-state image sensing apparatus according to the first embodiment of the present invention will be described below with reference to the timing charts shown in FIGS. 2A and 2B.

The read operation for the output signal from the light-shielded pixel unit 1, which is used when the incident light amount is small, in the solid-state image sensing apparatus according to the first embodiment of the present invention will be described first in detail with reference to the timing chart shown in FIG. 2A.

In the vertical scanning circuit 3, the light-shielded pixel PIX11 and the effective pixels PIX21 and PIX31 are selected by the row select signal φV1 of "H" level. The pixel signals are input to the noise suppressing circuit 4 through the vertical signal lines V1 to V3 so that pixel signals with suppressed noise are obtained. At this time, the pixel signal components of the light-shielded pixel PIX11 and the effective pixels PIX21 and PIX31 are held in CDS1 to CDS3 of the noise suppressing circuit 4. After that, the horizontal scanning circuit 5 sequentially outputs the column select signals φH1 to φH3 of "H" level. Accordingly, the pixel signal components of the light-shielded pixel PIX11 and the effective pixels PIX21 and PIX31, which are stored in the noise suppressing circuit 4, are read out through the horizontal select switches M31, M32, and M33 in the time-series order and output through the output amplifier 6. In this example, the signal output levels of the effective pixels PIX21 and PIX31 are corrected on the basis of the signal output level of the light-shielded pixel PIX11.

The read operation for a reference signal different from the output from the light-shielded pixel unit 1, which is used when very strong light such as a spotlight or sunlight is incident, in the solid-state image sensing apparatus according to the first embodiment of the present invention will be described next in detail with reference to the timing chart shown in FIG. 2B. In the vertical scanning circuit 3, the light-shielded pixel PIX11 and the effective pixels PIX21 and PIX31 are selected by the row select signal φV1 of "H" level. The pixel signals are input to the noise suppressing circuit 4 through the vertical signal lines V1 to V3.

At this time, a reference signal component which is different from the pixel signal component of the light-shielded pixel PIX11 is held in CDS1 of the noise suppressing circuit 4. The pixel signal components of the effective pixels PIX21 and PIX31 are held in CDS2 and CDS3. After that, the horizontal scanning circuit 5 sequentially outputs the column select signals φH1 to φH3 of "H" level. Accordingly, the reference signal component and the pixel signal components of the effective pixels PIX21 and PIX31, which are stored in the noise suppressing circuit 4, are read out through the horizontal select switches M31, M32, and M33 in the time-series order and output through the output amplifier 6. In this example, the signal output levels of the effective pixels PIX21 and PIX31 are corrected on the basis of the reference signal component different from the pixel signal component of the light-shielded pixel PIX11.

As described above, in the first embodiment, when very strong light such as a spotlight or sunlight is incident, a reference signal component different from the signal components of the light-shielded pixels PIX11 to PIX13 is output. With this arrangement, an image which is not influenced by a black level variation observed in the light-shielded pixels PIX11 to PIX13 can be obtained. In addition, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened.

(Second Embodiment)

Figure 3:
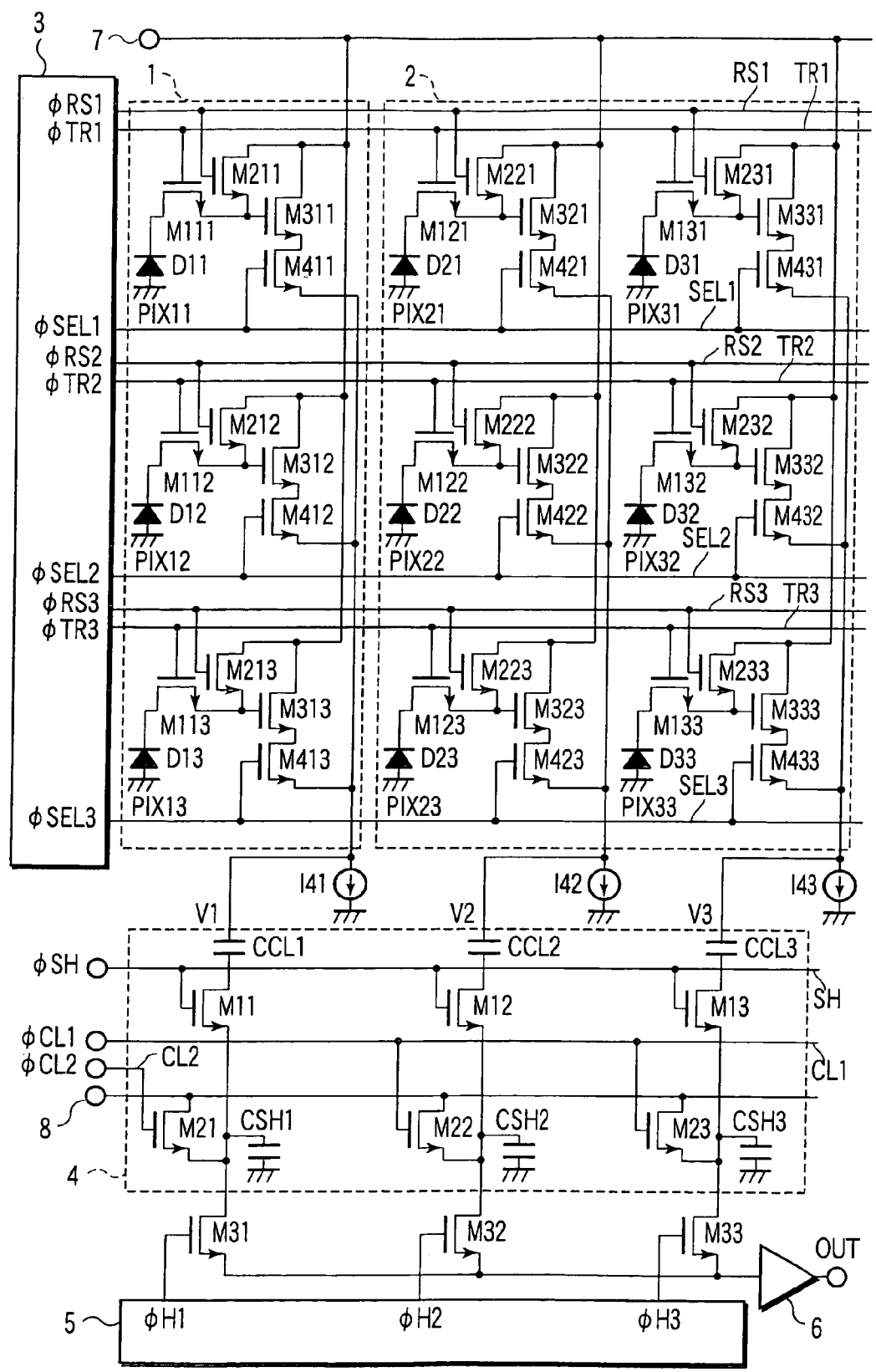
FIG. 3 is a view showing the arrangement of a solid-state image sensing apparatus according to the second embodiment of the present invention.

FIG. 3 shows the arrangement of a solid-state image sensing apparatus according to the second embodiment of the present invention. This will be described.

The same reference numerals as in the first embodiment (FIG. 1) denote the same constituent elements in the second embodiment. Different parts will mainly be described, and a repetitive description will be omitted.

Referring to FIG. 3, reference symbols RS1 to RS3 denote pixel reset lines serving as first row select lines; TR1 to TR3, PD signal transfer lines serving as second row select lines; and SEL1 to SEL3 denote pixel output select lines serving as third row select lines. Pixel reset signals, PD signal transfer signals, and pixel output select signals sent to these lines are indicated by φRS1 to φRS3, φTR1 to φTR3, and φSEL1 to φSEL3, respectively.

A pixel power supply line 7 supplies a power to reset MOS transistors M211 to M233 and amplification MOS transistors M311 to M333.

Pixels PIX11 to PIX33 which form a light-shielded pixel unit 1 and an effective pixel unit 2 include photodiodes D11 to D33, transfer MOS transistors M111 to M133, the reset MOS transistors M211 to M233, the amplification MOS transistors M311 to M333, and select MOS transistors M411 to M433, respectively. The transfer MOS transistors M111 to M133 cause the photodiodes D11 to D33 to transfer charges and read them out. The reset MOS transistors M211 to M233 reset the transferred charges. The amplification MOS transistors M311 to M333 amplify the charges in the photodiodes D11 to D33. The select MOS transistors M411 to M433 select rows.

More specifically, the gates of the reset MOS transistors M211, M221, and M231 are connected to the pixel reset line RS1. The gates of the reset MOS transistors M212, M222, and M232 are connected to the pixel reset line RS2. The gates of the reset MOS transistors M213, M223, and M233 are connected to the pixel reset line. RS3.

The gates of the transfer MOS transistors M111, M121, and M131 are connected to the PD signal transfer line TR1. The gates of the transfer MOS transistors M112, M122, and M132 are connected to the PD signal transfer line TR2. The gates of the transfer MOS transistors M113, M123, and M133 are connected to the PD signal transfer line TR3.

The gates of the select MOS transistors M411, M421, and M431 are connected to the pixel output select line SEL1. The gates of the select MOS transistors M412, M422, and M432 are connected to the pixel output select line SEL2. The gates of the select MOS transistors M413, M423, and M433 are connected to the pixel output select line SEL3.

A vertical scanning circuit 3 outputs pixel reset signals φRS1 to φRS3, PD signal transfer signals φTR1 to φTR3, and pixel output select signals φSEL1 to φSEL3. The above-described units are driven and controlled by these signals.

Reference symbols V1 to V3 denote vertical signal lines to extract the output signals from the amplification MOS transistors M311 to M313, M321 to M323, and M331 to M333. Reference symbols I41 to I43 denote current sources to bias the vertical signal lines V1 to V3.

A noise suppressing circuit 4 includes clamp capacitors CCL1 to CCL3 connected to the vertical signal lines V1 to V3, sample-and-hold switches MN1 to M13, clamp switches M21 to M23, and sample-and-hold capacitors CSH1 to CSH3.

The clamp capacitors CCL1 to CCL3 store the reset levels of the vertical signal lines V1 to V3. The sample-and-hold capacitors CSH1 to CSH3 store the amplification components of the vertical signal lines V1 to V3.

The sample-and-hold switches M11 to M13 transmit the signals of the vertical signal lines V1 to V3 to the sample-and-hold capacitors CSH1 to CSH3. The gates of the sample-and-hold switches M11 to M13 are connected to a sample-and-hold control line SH and driven and controlled by a sample-and-hold control signal.

Each of the clamp switches M21 to M23 sets the terminal potential of one of a corresponding one of the clamp capacitors CCL1 to CCL3 and a corresponding one of the sample-and-hold capacitors CSH1 to CSH3 to a reference potential supplied from a clamp voltage line 8. The gate of the clamp switch M21 is connected to a clamp control line CL2 and driven and controlled by a clamp control signal φCL2. The gates of the clamp switches M22 and M23 are connected to a clamp control line CL1 and driven and controlled by a clamp control signal φCL1.

The connection points between the sample-and-hold capacitors CSH1 to CSH3 and the clamp switches M21 to M23 are connected to an output amplifier 6 through horizontal select switches M31 to M33. The gates of the horizontal select switches M31 to M33 are connected to the output terminals of a horizontal scanning circuit 5 for column select signals φH1 to φH3.

Figure 4A:
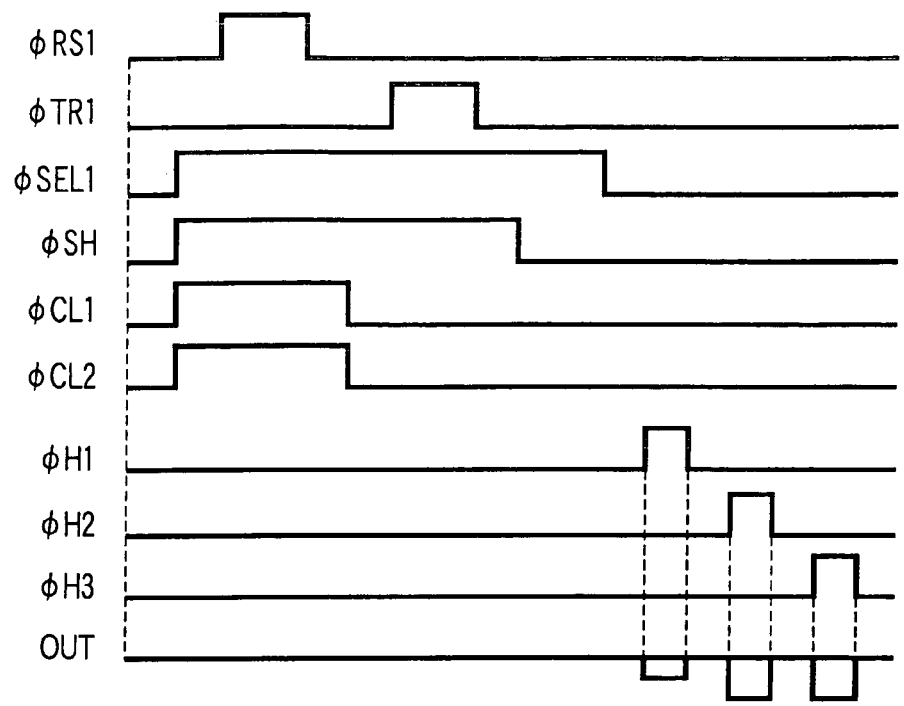
FIG. 4A is a timing chart of a read operation for an output signal from a light-shielded pixel unit 1, which is used when the incident light amount is small, in the solid-state image sensing apparatus according to the second embodiment.
Figure 4B:
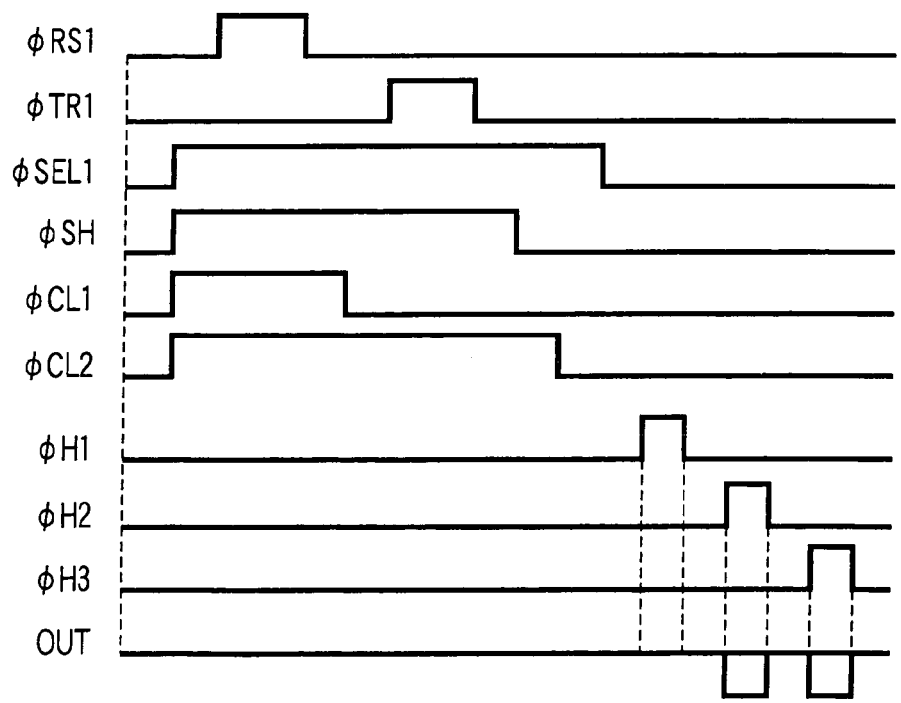
FIG. 4B is a timing chart of a read operation for a reference signal different from the output signal from the light-shielded pixel unit 1, which is used when very strong light is incident, in the solid-state image sensing apparatus according to the second embodiment.

The output signal read operation of the solid-state image sensing apparatus according to the second embodiment of the present invention will be described below with reference to the timing charts shown in FIGS. 4A and 4B.

The read operation for the output signal from the light-shielded pixel unit 1, which is used when the incident light amount is small, in the solid-state image sensing apparatus according to the second embodiment of the present invention will be described first in detail with reference to the timing chart shown in FIG. 4A.

When light becomes incident on the photodiodes D11 to D33 of the pixels PIX11 to PIX33, the photodiodes D11 to D33 generate and store optical signal charges. The stored pixel signals are sequentially read out to the vertical signal lines V1 to V3 for the respective rows while being vertically scanned by the vertical scanning circuit 3.

The operation in selecting the pixels of the first row will be described.

First, the pixel output select signal φSEL1 is set to "H" level to connect the amplification MOS transistors M311, M321, and M331 to the vertical signal lines V1 to V3 and current sources I41 to I43 through the row select MOS transistors M411, M421, and M431. Before the read of optical signal charges from the photodiodes D11 to D31, the pixel reset signal φRS1 is set to "H" level to reset the gates of the amplification MOS transistors M311, M321, and M331 to the pixel power supply through the reset MOS transistors M211, M221, and M231.

In addition, both a sample-and-hold control signal φSH and the clamp control signals φCL1 and φCL2 are set to "H" level to initialize the terminal potentials of the clamp capacitors CCL1 to CCL3 and sample-and-hold capacitors CSH1 to CSH3 to the potential of the clamp voltage line 8 through the sample-and-hold switches M11 to M13 and clamp switches M21 to M23. Next, the pixel reset signal φRS1 is returned to "L" level to disconnect the pixel power supply line 7 from the gates of the amplification MOS transistors M311, M321, and M331. At this timing, the reset signal components of the vertical signal lines V1 to V3 are stored in the clamp capacitors CCL1 to CCL3.

With this operation, the reset signal components containing reset noise and element variations in the amplification MOS transistors M311, M321, and M331 are stored in the clamp capacitors CCL1 to CCL3. After the end of signal storage in the clamp capacitors CCL1 to CCL3, the clamp control signals φCL1 and φCL2 are set to "L" level to set the connection points between the sample-and-hold capacitors CSH1 to CSH3 and the clamp switches M21 to M23 in a high-impedance state.

After that, the PD signal transfer signal φTR1 is set to "H" level to transfer the optical signal charges in the photodiodes D11 to D31 to the gates of the amplification MOS transistors M311, M321, and M331 through the transfer MOS transistors M111, M121, and M131. After the end of transfer, the PD signal transfer signal φTR1 is returned to "L" level to disconnect the photodiodes D11 to D31 from the gates of the amplification MOS transistors M311, M321, and M331.

At this timing, potential variations as the voltage differences between the reset signal components and the optical signal components, which appear on the vertical signal lines V1 to V3, are stored in the sample-and-hold capacitors CSH1 to CSH3 through the clamp capacitors CCL1 to CCL3 and sample-and-hold switches MN1 to M13. After that, when the sample-and-hold control signal φSH is returned to "L" level, the optical signal components of all pixel cells of the light-shielded pixel PIX11 and effective pixels PIX21 and PIX31 are held in the sample-and-hold capacitors CSH1 to CSH3. The column select signals φH1 to φH3 from the horizontal scanning circuit 5 are sequentially set to "H" level. Accordingly, the voltages held in the sample-and-hold capacitors CSH1 to CSH3 are read out through the horizontal select switches M31 to M33 and sequentially output through the output amplifier 6.

The read of the pixel cells connected to the first row is thus completed. In the second embodiment, the signal output levels of the effective pixels PIX21 and PIX31 are corrected on the basis of the signal output level of the light-shielded pixel PIX11. In the same way as described above, the signals of the pixel cells connected to the second and subsequent rows are sequentially read out in accordance with the row select signals from the vertical scanning circuit 3 so that the read of all pixel cells is ended.

The read operation for a reference signal different from the output from the light-shielded pixel unit 1, which is used when very strong light such as a spotlight or sunlight is incident, in the solid-state image sensing apparatus according to the second embodiment of the present invention will be described next in detail with reference to the timing chart shown in FIG. 4B. The operation until reset signal components are stored in the clamp capacitors CCL1 to CCL3 is the same as in FIG. 4A, and repetitive description will be omitted.

After the end of storage in the clamp capacitors CCL1 to CCL3, the clamp control signal φCL1 is set to "L" level to set the connection points between the sample-and-hold capacitors CSH2 and CSH3 and the clamp switches M22 and M23 in a high-impedance state. On the other hand, the clamp control signal φCL1 holds "H" level. The terminal potentials of the clamp capacitor CCL1 and sample-and-hold capacitor CSH1 are still fixed to the potential of the clamp voltage line 8. After that, the PD signal transfer signal φTR1 is set to "H" level to transfer the optical signal charges in the photodiodes D11 to D31 to the gates of the amplification MOS transistors M311, M321, and M331 through the transfer MOS transistors M111, M121, and M131.

After the end of transfer, the PD signal transfer signal φTR1 is returned to "L" level to disconnect the photodiodes D11 to D31 from the gates of the amplification MOS transistors M311, M321, and M331.

At this time, potential variations as the voltage differences between the reset signal components and the optical signal components, which appear on the vertical signal lines V2 and V3, are stored in the sample-and-hold capacitors CSH2 and CSH3 through the clamp capacitors CCL2 and CCL3 and sample-and-hold switches M12 and M13. On the other hand, the clamp control signal φCL2 holds "H" level. The terminal potentials of the clamp capacitor CCL1 and sample-and-hold capacitor CSH1 are still fixed to the potential of the clamp voltage line 8. After that, the sample-and-hold control signal φSH is returned to "L" level, and the clamp control signal φCL2 is set to "L" level. Accordingly, the clamp voltage level as the potential of the clamp voltage line 8 is held in the sample-and-hold capacitor CSH1. The optical signal components of the effective pixels PIX21 and PIX31 are held in the sample-and-hold capacitors CSH2 and CSH3.

Finally, the column select signals φH1 to φH3 from the horizontal scanning circuit 5 are sequentially set to "H" level. Accordingly, the voltages held in the sample-and-hold capacitors CSH1 to CSH3 are read out through the horizontal select switches M31 to M33 and sequentially output through the output amplifier 6. The read of the pixel cells connected to the first row is thus completed.

In the second embodiment, the signal output levels of the effective pixels PIX21 and PIX31 are corrected on the basis of the clamp voltage level as the potential of the clamp voltage line 8. In the same way as described above, the signals of the pixel cells connected to the second and subsequent rows are sequentially read out in accordance with the row select signals from the vertical scanning circuit 3 so that the read of all pixel cells is ended.

As described above, in the second embodiment, when very strong light such as a spotlight or sunlight is incident, a reference signal level different from the signal components of the light-shielded pixels PIX11 to PIX13 is output. With this arrangement, an image which is not influenced by a black level variation observed in the light-shielded pixels PIX11 to PIX13 can be obtained. In addition, one control line for the noise suppressing circuit 4 is added to change the drive timing. This change makes it possible to select whether the signal components from the light-shielded pixels PIX11 to PIX13 or the reference signal level is to be output. Hence, the increase in chip area can be minimized. Furthermore, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened.

(Third Embodiment)

FIG. 5 shows the arrangement of a solid-state image sensing apparatus according to the third embodiment of the present invention. This will be described.

The same reference numerals as in the second embodiment (FIG. 3) denote the same constituent elements in the third embodiment. Different parts will mainly be described, and repetitive description will be omitted.

Referring to FIG. 5, the solid-state image sensing apparatus according to the third embodiment employs a different driving method for a noise suppressing circuit 4.

In the above-described second embodiment, all the gates of the sample-and-hold switches M11 to M13 are connected to the sample-and-hold control line SH. In the third embodiment, the gate of a sample-and-hold switch MN1 is connected to a sample-and-hold control line SH2. The gates of sample-and-hold switches M12 and M13 are connected to a sample-and-hold control line SH1.

That is, in the third embodiment, the sample-and-hold switch M11 is driven and controlled by a sample-and-hold control signal φSH2. The sample-and-hold switches M12 and M13 are driven and controlled by a sample-and-hold control signal φSH1.

In addition, in the above-described second embodiment, the gate of the clamp switch M21 is connected to the clamp control line CL2, and the gates of the clamp switches M22 and M23 are connected to the clamp control line CL1. In the third embodiment, the gates of clamp switches M21 to M23 are connected to a clamp control line CL. That is, all the clamp switches M21 to M23 are driven and controlled by a clamp control signal φCL. The remaining parts are the same as in FIG. 3.

Figure 6A:
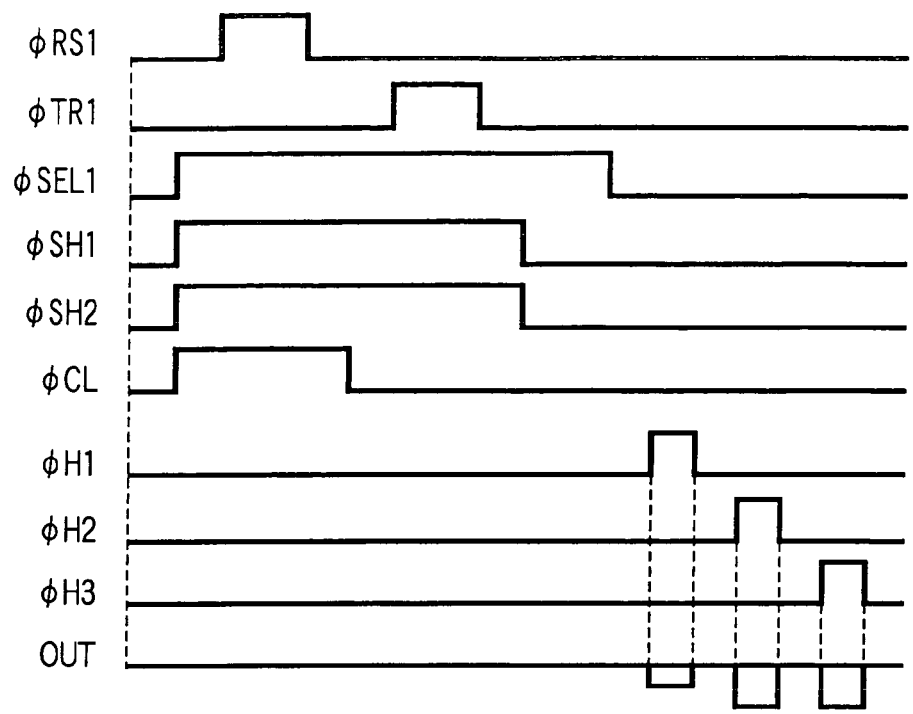
FIG. 6A is a timing chart of a read operation for an output signal from a light-shielded pixel unit 1, which is used when the incident light amount is small, in the solid-state image sensing apparatus according to the third embodiment.

The read operation for the output signal from a light-shielded pixel unit 1, which is used when the incident light amount is small, in the solid-state image sensing apparatus according to the third embodiment of the present invention will be described first with reference to the timing chart shown in FIG. 6A. The sample-and-hold control signals φSH1 and φSH2 are driven at the same timing as that of the sample-and-hold control signal φSH in FIG. 4A. The clamp control signal φCL is driven at the same timing as that of the clamp control signal φCL1 in FIG. 4A. In this case, the drive timing is the same as in FIG. 4(A), and repetitive description will be omitted.

Figure 6B:
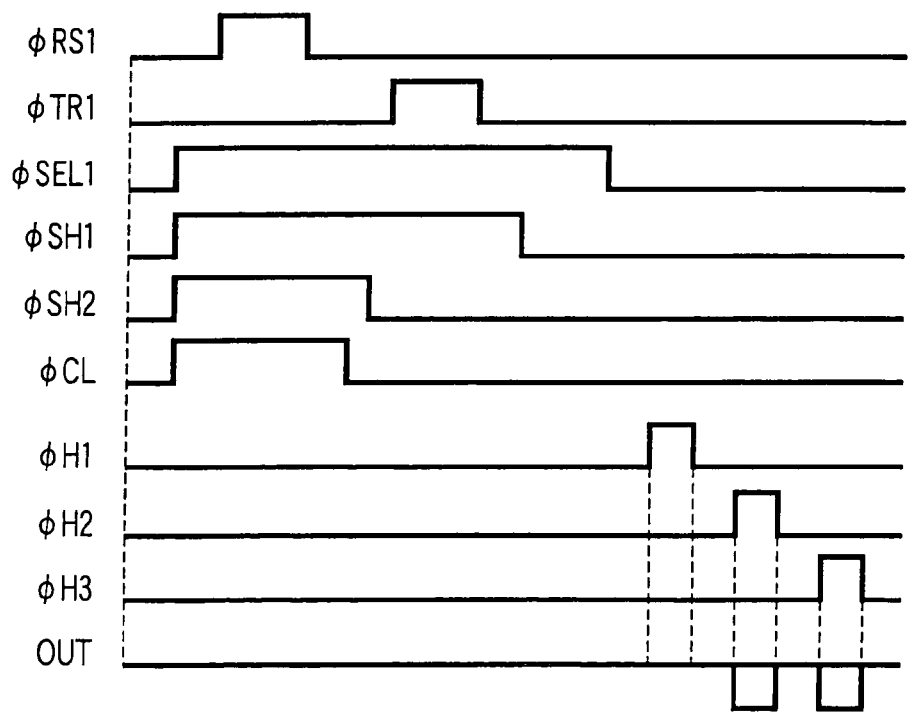
FIG. 6B is a timing chart of a read operation for a reference signal different from the output signal from the light-shielded pixel unit 1, which is used when very strong light is incident, in the solid-state image sensing apparatus according to the third embodiment.

The read operation for a reference signal different from the output from the light-shielded pixel unit 1, which is used when very strong light such as a spotlight or sunlight is incident, in the solid-state image sensing apparatus according to the third embodiment of the present invention will be described next in detail with reference to the timing chart shown in FIG. 6B. The operation until reset signal components are stored in clamp capacitors CCL1 to CCL3 is the same as in FIG. 4A, and a repetitive description will be omitted.

After the end of storage in the clamp capacitors CCL1 to CCL3, the clamp control signal φCL is set to "L" level to set the connection points between sample-and-hold capacitors CSH1 to CSH3 and the clamp switches M21 to M23 in a high-impedance state. Subsequently, the sample-and-hold control signal φSH2 is returned to "L" level to cause the sample-and-hold capacitor CSH1 to hold the clamp voltage level as the potential of a clamp voltage line 8.

After that, a PD signal transfer signal φTR1 is set to "H" level to transfer optical signal charges in photodiodes D11 to D31 to the gates of amplification MOS transistors M311, M321, and M331 through transfer MOS transistors M111, M121, and M131. After the end of transfer, the PD signal transfer signal φTR1 is returned to "L" level to disconnect the photodiodes D11 to D31 from the gates of the amplification MOS transistors M311, M321, and M331.

At this timing, potential variations as the voltage differences between the reset signal components and the optical signal components, which appear on vertical signal lines V2 and V3, are stored in the sample-and-hold capacitors CSH2 and CSH3 through clamp capacitors CCL2 and CCL3 and sample-and-hold switches M12 and M13.

On the other hand, the sample-and-hold capacitor CSH1 continuously holds the clamp voltage level as the potential of the clamp voltage line 8. After that, the sample-and-hold control signal φSH1 is returned to "L" level. Accordingly, the clamp voltage level as the potential of the clamp voltage line 8 is held in the sample-and-hold capacitor CSH1. The optical signal components of effective pixels PIX21 and PIX31 are held in the sample-and-hold capacitors CSH2 and CSH3. Finally, column select signals φH1 to φH3 from a horizontal scanning circuit 5 are sequentially set to "H" level. Accordingly, the voltages held in the sample-and-hold capacitors CSH1 to CSH3 are read out through horizontal select switches M31 to M33 and sequentially output through an output amplifier 6. The read of the pixel cells connected to the first row is thus completed.

In the third embodiment, the signal output levels of the effective pixels PIX21 and PIX31 are corrected on the basis of the clamp voltage level as the potential of the clamp voltage line 8. In the same way as described above, the signals of the pixel cells connected to the second and subsequent rows are sequentially read out in accordance with the row select signals from a vertical scanning circuit 3 so that the read of all pixel cells is ended.

As described above, in the third embodiment, when very strong light such as a spotlight or sunlight is incident, a reference signal level different from the signal components of light-shielded pixels PIX11 to PIX13 is output. With this arrangement, an image which is not influenced by a black level variation observed in the light-shielded pixels PIX11 to PIX13 can be obtained. In addition, one control line for a noise suppressing circuit 4 is added to change the drive timing. This change makes it possible to select whether the signal components from the light-shielded pixels PIX11 to PIX13 or the reference signal level is to be output. Hence, the increase in chip area can be minimized. Furthermore, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened.

(Fourth Embodiment)

FIG. 7 shows the arrangement of a solid-state image sensing apparatus according to the fourth embodiment of the present invention. This will be described.

The same reference numerals as in the second embodiment (FIG. 3) denote the same constituent elements in the fourth embodiment. Different parts will mainly be described, and repetitive description will be omitted.

Referring to FIG. 7, the solid-state image sensing apparatus according to the fourth embodiment employs a different driving method for a noise suppressing circuit 4. More specifically, vertical signal lines V1 to V3 have reset signal switches M41 to M43, optical signal switches M51 to M53, reset signal capacitors CSHR1 to CSHR3, and optical signal capacitors CSHS1 to CSHS3, respectively. The reset signal capacitors CSHR1 to CSHR3 store the reset levels of the vertical signal lines V1 to V3. The optical signal capacitors CSHS1 to CSHS3 store the optical signal levels of the vertical signal lines V1 to V3. The gates of the reset signal switches M41 to M43 are connected to a reset signal sample control line SHR and driven and controlled by a reset signal sample control signal φSHR. The gate of the optical signal switch M51 is connected to an optical signal sample control line SHS2 and driven and controlled by an optical signal sample control signal φSHS2. The gates of the optical signal switches M52 and M53 are connected to an optical signal sample control line SHS1 and driven and controlled by an optical signal sample control signal φSHS1. Horizontal select switches M61 to M63 and M71 to M73 read out signals held in the reset signal capacitors CSHR1 to CSHR3 and optical signal capacitors CSHS1 to CSHS3. A differential circuit 9 obtains the difference between a reset component and an optical signal component. The remaining parts are the same as in FIG. 3.

Figure 8A:
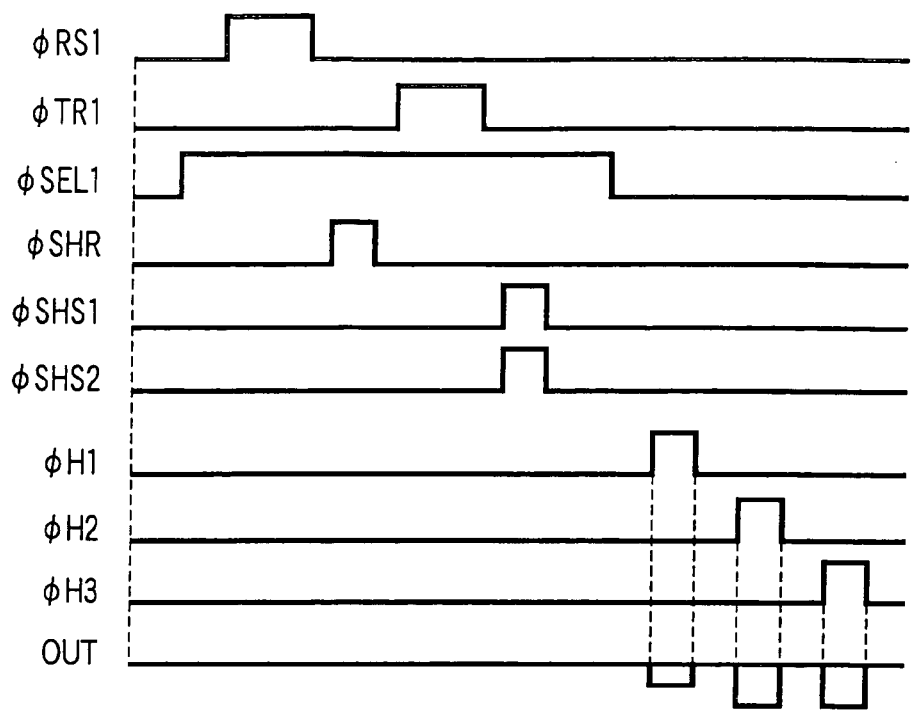
FIG. 8A is a timing chart of a read operation for an output signal from a light-shielded pixel unit 1, which is used when the incident light amount is small, in the solid-state image sensing apparatus according to the fourth embodiment.

The read operation for the output signal from a light-shielded pixel unit 1, which is used when the incident light amount is small, in the solid-state image sensing apparatus according to the fourth embodiment of the present invention will be described first with reference to the timing chart shown in FIG. 8A.

When light becomes incident on photodiodes D11 to D33 of pixels PIX11 to PIX33, the photodiodes D11 to D33 generate and store optical signal charges. The stored pixel signals are sequentially read out to the vertical signal lines V1 to V3 for the respective rows while being vertically scanned by a vertical scanning circuit 3.

The operation in selecting the pixels of the first row will be described.

First, a pixel output select signal φSEL1 is set to "H" level to connect amplification MOS transistors M311, M321, and M331 to the vertical signal lines V1 to V3 and current sources I41 to I43 through row select MOS transistors M411, M421, and M431. Before the read of optical signal charges from the photodiodes D11 to D31, a pixel reset signal φRS1 is set to "H" level to reset the gates of the amplification MOS transistors M311, M321, and M331 to the pixel power supply through reset MOS transistors M211, M221, and M231. Next, the pixel reset signal φRS1 is returned to "L" level to disconnect a pixel power supply line 7 from the gates of the amplification MOS transistors M311, M321, and M331.

Subsequently, the reset signal sample control signal φSHR is set to "H" level to store the reset signal components of the vertical signal lines V1 to V3 in the reset signal capacitors CSHR1 to CSHR3 through the reset signal switches M41 to M43. After the end of storage in the reset signal capacitors CSHR1 to CSHR3, the reset signal sample control signal φSHR is returned to "L" level to cause the reset signal capacitors CSHR1 to CSHR3 to hold the stored reset signal components.

After that, a PD signal transfer signal φTR1 is set to "H" level to transfer the optical signal charges in the photodiodes D11 to D31 to the gates of the amplification MOS transistors M311, M321, and M331 through transfer MOS transistors M111, M121, and M131. After the end of transfer, the PD signal transfer signal φTR1 is returned to "L" level to disconnect the photodiodes D11 to D31 from the gates of the amplification MOS transistors M311, M321, and M331.

Subsequently, the optical signal sample control signals φSHS1 and φSHS2 are set to "H" level to store the optical signal components of the vertical signal lines V1 to V3 in the optical signal capacitors CSHS1 to CSHS3 through the optical signal switches M51 to M53. After the end of storage in the optical signal capacitors CSHS1 to CSHS3, the optical signal sample control signals φSHS1 and φSHS2 are returned to "L" level to cause the optical signal capacitors CSHS1 to CSHS3 to hold the stored optical signal components. Finally, column select signals φH1 to φH3 from a horizontal scanning circuit 5 are sequentially set to "H" level. Accordingly, the voltages held in the reset signal capacitors CSHR1 to CSHR3 and optical signal capacitors CSHS1 to CSHS3 are read out to the differential circuit 9 through the horizontal select switches M61 to M63 and M71 to M73. The differential circuit 9 obtains the difference between each reset signal component and a corresponding optical signal component and sequentially outputs the difference to a sensor output line OUT.

The read of the pixel cells connected to the first row is thus completed. In the fourth embodiment, the signal output levels of the effective pixels PIX21 and PIX31 are corrected on the basis of the signal output level of the light-shielded pixel PIX11. In the same way as described above, the signals of the pixel cells connected to the second and subsequent rows are sequentially read out in accordance with the signals from the vertical scanning circuit 3 so that the read of all pixel cells is ended.

Figure 8B:
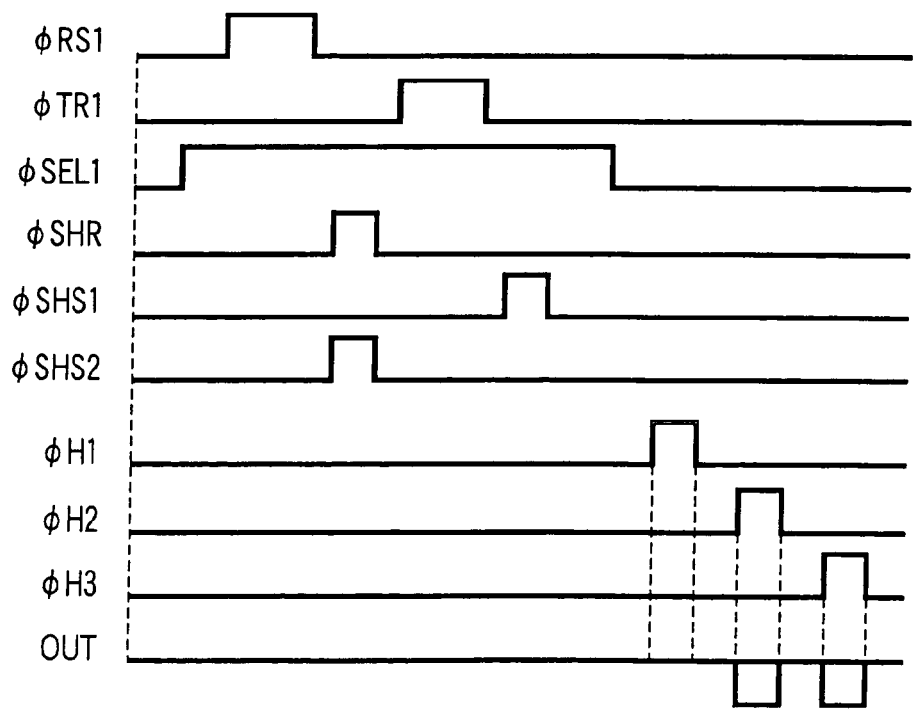
FIG. 8B is a timing chart of a read operation for a reference signal different from the output signal from the light-shielded pixel unit 1, which is used when very strong light is incident, in the solid-state image sensing apparatus according to the fourth embodiment.

The read operation for a reference signal different from the output from the light-shielded pixel unit 1, which is used when very strong light such as a spotlight or sunlight is incident, in the solid-state image sensing apparatus according to the fourth embodiment of the present invention will be described next in detail with reference to the timing chart shown in FIG. 8B. First, the pixel output select signal φSEL1 is set to "H" level to connect the amplification MOS transistors M311, M321, and M331 to the vertical signal lines V1 to V3 and the current sources I41 to I43 through the row select MOS transistors M411, M421, and M431.

Before the read of optical signal charges from the photodiodes D11 to D31, the pixel reset signal φRS1 is set to "H" level to reset the gates of the amplification MOS transistors M311, M321, and M331 to the pixel power supply through the reset MOS transistors M211, M221, and M231.

Next, the pixel reset signal φRS1 is returned to "L" level to disconnect the pixel power supply line 7 from the gates of the amplification MOS transistors M311, M321, and M331. Subsequently, the reset signal sample control signal φSHR is set to "H" level to store the reset signal components of the vertical signal lines V1 to V3 in the reset signal capacitors CSHR1 to CSHR3 through the reset signal switches M41 to M43.

Simultaneously, the optical signal sample control signal φSHS2 is set to "H" level to store the reset signal component of the vertical signal line V1 in the optical signal capacitor CSHS1 through the optical signal switch M51. After the end of storage in the reset signal capacitors CSHR1 to CSHR3 and storage in optical signal capacitors CSHS1 to CSHS3, the reset signal sample control signal φSHR and optical signal sample control signal φSHS2 are returned to "L" level to cause the reset signal capacitors CSHR1 to CSHR3 and optical signal capacitor CSHS1 to hold the stored reset signal components.

After that, the PD signal transfer signal φTR1 is set to "H" level to transfer the optical signal charges in the photodiodes D11 to D31 to the gates of the amplification MOS transistors M311, M321, and M331 through the transfer MOS transistors M111, M121, and M131. After the end of transfer, the PD signal transfer signal φTR1 is returned to "L" level to disconnect the photodiodes D11 to D31 from the gates of the amplification MOS transistors M311, M321, and M331. Subsequently, the optical signal sample control signal φSHS1 is set to "H" level to store the optical signal components of the vertical signal lines V2 and V3 in the optical signal capacitors CSHS2 and CSHS3 through the optical signal switches M52 and M53.

After the end of storage in the optical signal capacitors CSHS2 and CSHS3, the optical signal sample control signal φSHS1 is returned to "L" level to cause the optical signal capacitors CSHS2 and CSHS3 to hold the stored optical signal components. Finally, the column select signals φH1 to φH3 from the horizontal scanning circuit 5 are sequentially set to "H" level. Accordingly, the voltages held in the reset signal capacitors CSHR1 to CSHR3 and optical signal capacitors CSHS1 to CSHS3 are read out to the differential circuit 9 through the horizontal select switches M61 to M63 and M71 to M73. The differential circuit 9 obtains the difference between each reset signal component and a corresponding optical signal component and sequentially outputs the difference to the sensor output line OUT.

The read of the pixel cells connected to the first row is thus completed.

In the fourth embodiment, both the reset signal capacitor CSHR1 and the optical signal capacitor CSHS1 hold the reset signal components. For this reason, the output from the differential circuit 9 is zero. The signal output levels of the effective pixels PIX21 and PIX31 are corrected on the basis of the zero output from the differential circuit 9. In the same way as described above, the signals of the pixel cells connected to the second and subsequent rows are sequentially read out in accordance with the signals from the vertical scanning circuit 3 so that the read of all pixel cells is ended.

As described above, in the fourth embodiment, when very strong light such as a spotlight or sunlight is incident, a reference signal level different from the signal components of the light-shielded pixels PIX11 to PIX13 is output. With this arrangement, an image which is not influenced by a black level variation observed in the light-shielded pixels PIX11 to PIX13 can be obtained. In addition, one control line for the noise suppressing circuit 4 is added to change the drive timing. This change makes it possible to select whether the signal components from the light-shielded pixels PIX11 to PIX13 or the reference signal level is to be output. Hence, the increase in chip area can be minimized. Furthermore, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened. In addition, any degradation in characteristic due to power supply noise, GND noise, common mode noise component, and the like can be suppressed by executing differential processing.

(Fifth Embodiment)

Figure 9:
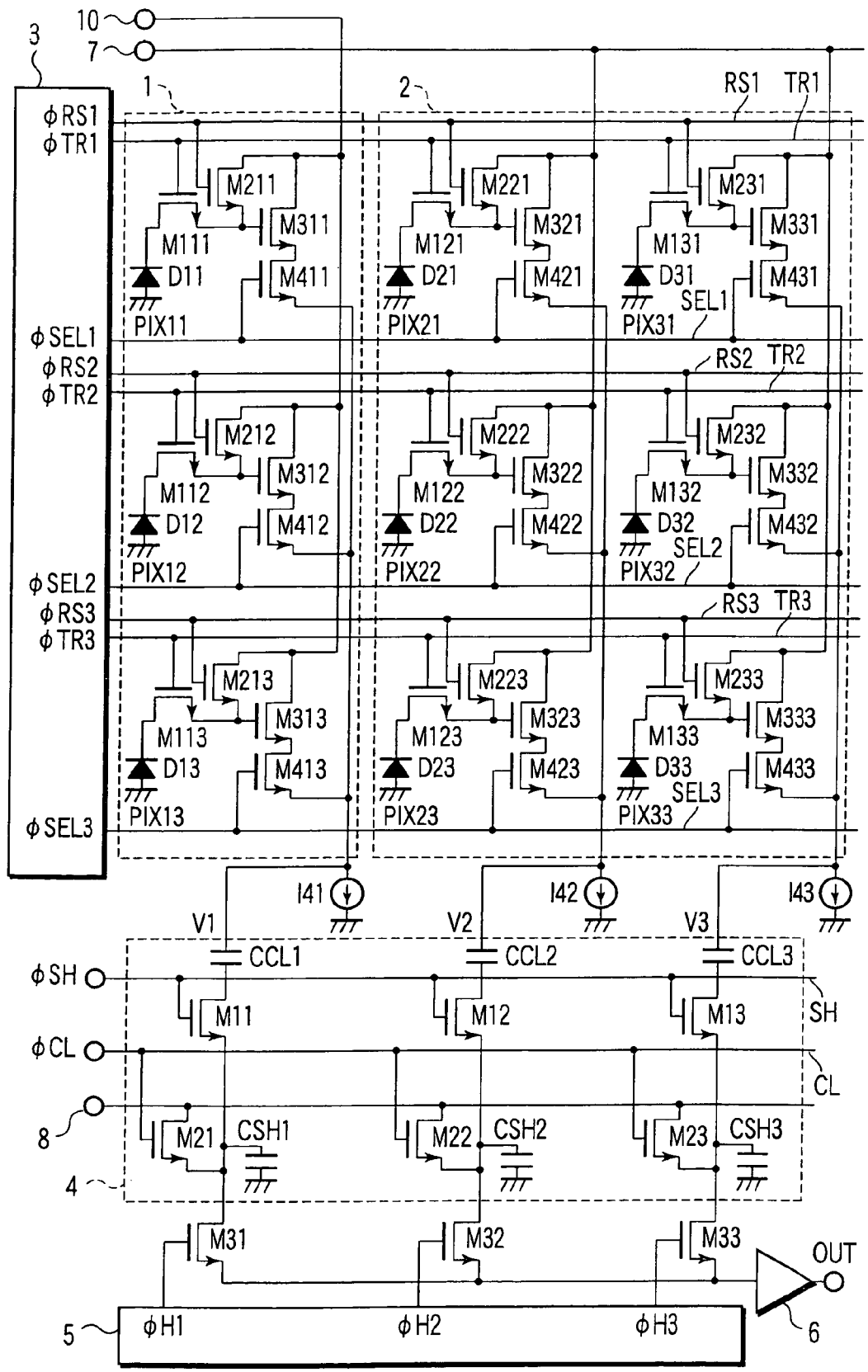
FIG. 9 is a view showing the arrangement of a solid-state image sensing apparatus according to the fifth embodiment of the present invention.

FIG. 9 shows the arrangement of a solid-state image sensing apparatus according to the fifth embodiment of the present invention. This will be described.

The same reference numerals as in the second embodiment (FIG. 3) denote the same constituent elements in the fifth embodiment. Different parts will mainly be described, and repetitive description will be omitted.

Referring to FIG. 9, as a characteristic feature of the solid-state image sensing apparatus according to the fifth embodiment, a light-shielded pixel power supply line 10 which supplies a power to a light-shielded pixel unit 1 is newly added independently of an effective pixel power supply line 7 which supplies a power to an effective pixel unit 2. In the second embodiment, the gate of the clamp switch M21 is connected to the clamp control line CL2, and the gates of the clamp switches M22 and M23 are connected to the clamp control line CL1. In the fifth embodiment, the gates of clamp switches M21 to M23 of a noise suppressing circuit 4 are connected to a clamp control line CL and driven and controlled by a clamp control signal φCL.

Figure 10A:
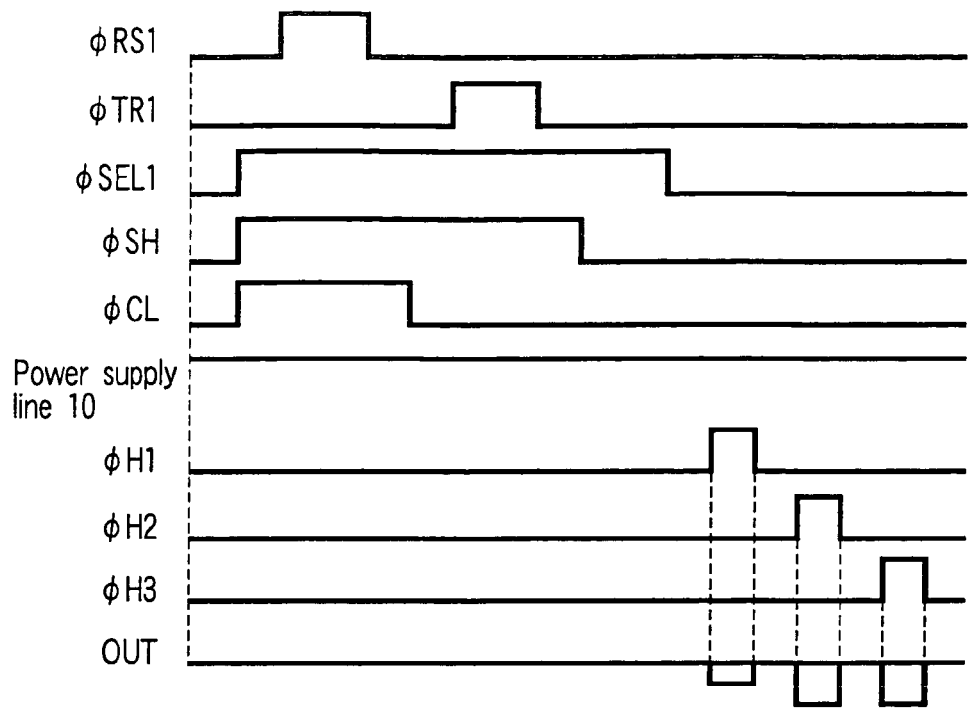
FIG. 10A is a timing chart of a read operation for an output signal from a light-shielded pixel unit 1, which is used when the incident light amount is small, in the solid-state image sensing apparatus according to the fifth embodiment.

The read operation for the output signal from the light-shielded pixel unit 1, which is used when the incident light amount is small, in the solid-state image sensing apparatus according to the fifth embodiment of the present invention will be described first with reference to the timing chart shown in FIG. 10A. The light-shielded pixel power supply line 10 and effective pixel power supply line 7 are set to a common potential. A sample-and-hold control signal φSH is set to "H" level at the same timing as that of the sample-and-hold control signal φSH in FIG. 4A. The clamp control signal φCL is set to "H" level at the same timing as that of the clamp control signal φCL1 in FIG. 4A. In this case, the drive timing is the same as in FIG. 4A, and repetitive description will be omitted.

Figure 10B:
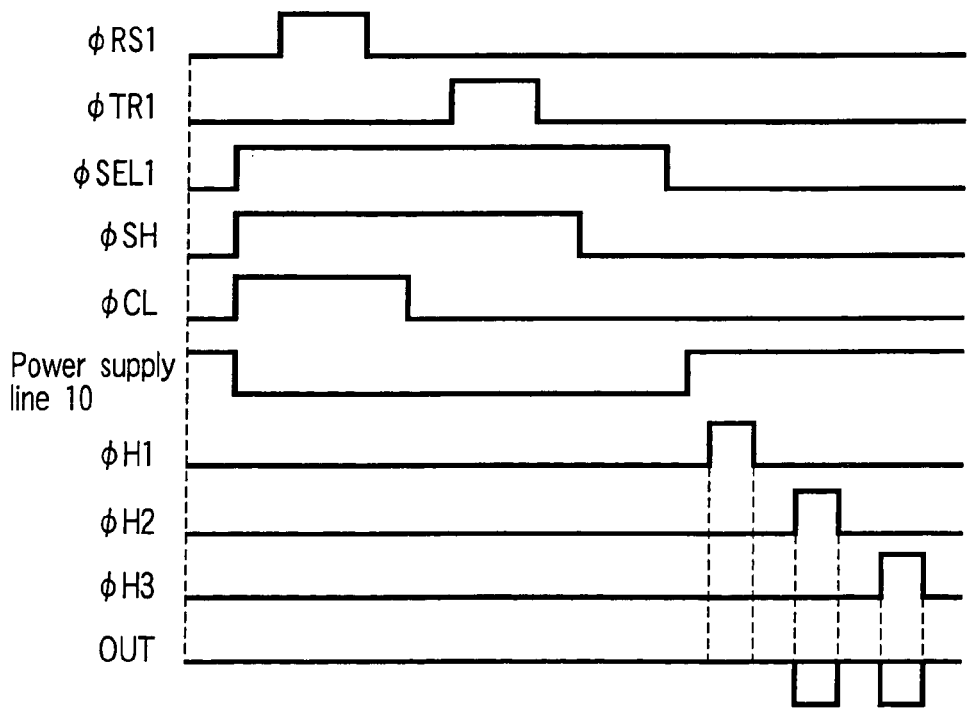
FIG. 10B is a timing chart of a read operation for a reference signal different from the output signal from the light-shielded pixel unit 1, which is used when very strong light is incident, in the solid-state image sensing apparatus according to the fifth embodiment.

The read operation for a reference signal different from the output from the light-shielded pixel unit 1, which is used when very strong light such as a spotlight or sunlight is incident, in the solid-state image sensing apparatus according to the fifth embodiment of the present invention will be described next in detail with reference to the timing chart shown in FIG. 10B. In this case, the same driving operation as in FIG. 10A (FIG. 4A) is performed except that the light-shielded pixel power supply line 10 is fixed to the GND potential.

First, a pixel output select signal φSEL1 is set to "H" level to connect amplification MOS transistors M321 and M331 to vertical signal lines V2 and V3 and current sources I42 and I43 through row select MOS transistors M421 and M431. On the other hand, a vertical signal line V1 is fixed to GND because there is no current path flowing to a pixel current source I41. Before the read of optical signal charges from photodiodes D11 to D31, a pixel reset signal φRS1 is set to "H" level to reset the gates of the amplification MOS transistors M321 and M331 to the effective pixel power supply line 7 through reset MOS transistors M221 and M231.

On the other hand, the gate potential of an amplification MOS transistor M311 is set to the GND potential. The potential is fixed to GND because the light-shielded pixel power supply line 10 is disconnected from the vertical signal line V1, and there is no current path flowing to the pixel current source I41. In addition, the sample-and-hold control signal φSH and the clamp control signal φCL are set to "H" level to initialize the terminal potentials of clamp capacitors CCL1 to CCL3 and sample-and-hold capacitors CSH1 to CSH3 to the potential of a clamp voltage line 8 through sample-and-hold switches M11 to M13 and clamp switches M21 to M23.

Next, the pixel reset signal φRS1 is returned to "L" level to disconnect the effective pixel power supply line 7 from the gates of the amplification MOS transistors M311, M321, and M331. At this time, the reset signal components of the vertical signal lines V2 and V3 are stored in the clamp capacitors CCL2 and CCL3. The GND component of the vertical signal line V1 is stored in the clamp capacitor CCL1. With this operation, the reset signal components containing reset noise and element variations in the amplification MOS transistors M311, M321, and M331 are stored in the clamp capacitors CCL2 and CCL3. After the end of storage in the clamp capacitors CCL1 to CCL3, the clamp control signal φCL is set to "L" level to set the connection points between the sample-and-hold capacitors CSH1 to CSH3 and the clamp switches M21 to M23 in a high-impedance state.

After that, a PD signal transfer signal φTR1 is set to "H" level to transfer the optical signal charges in the photodiodes D21 and D31 to the gates of the amplification MOS transistors M321 and M331 through the transfer MOS transistors M121 and M131. On the other hand, the optical signal charges in the photodiode D11 cannot be transferred because the gate potential of the amplification MOS transistor M311 is GND. The potential remains almost GND. After the end of transfer, the PD signal transfer signal φTR1 is returned to "L" level again to disconnect the photodiodes D11 to D31 from the gates of the amplification MOS transistors M311, M321, and M331.

At this time, potential variations as the voltage differences between the reset signal components and the optical signal components, which appear on the vertical signal lines V2 and V3, are stored in the sample-and-hold capacitors CSH2 and CSH3 through the clamp capacitors CCL2 and CCL3 and sample-and-hold switches M12 and M13. On the other hand, the vertical signal line V1 is kept at GND and does not vary. The sample-and-hold capacitor CSH1 holds the potential of the clamp voltage line 8.

After that, when the sample-and-hold control signal φSH is returned to "L" level again, the clamp voltage level as the potential of the clamp voltage line 8 is held in the sample-and-hold capacitor CSH1, and the optical signal components of effective pixels PIX21 and PIX31 are held in the sample-and-hold capacitors CSH2 and CSH3. Finally, column select signals φH1 to φH3 from a horizontal scanning circuit 5 are sequentially set to "H" level. Accordingly, the voltages held in the sample-and-hold capacitors CSH1 to CSH3 are read out through horizontal select switches M31 to M33 and sequentially output through an output amplifier 6. The read of the pixel cells connected to the first row is thus completed.

In the fifth embodiment, the signal output levels of the effective pixels PIX21 and PIX31 are corrected on the basis of the clamp voltage level as the potential of the clamp voltage line 8. In the same way as described above, the signals of the pixel cells connected to the second and subsequent rows are sequentially read out in accordance with row select signals from a vertical scanning circuit 3 so that the read of all pixel cells is ended.

As described above, in the fifth embodiment, when very strong light such as a spotlight or sunlight is incident, a reference signal level different from the signal components of light-shielded pixels PIX11 to PIX13 is output. With this arrangement, an image which is not influenced by a black level variation observed in the light-shielded pixels PIX11 to PIX13 can be obtained. In addition, a pixel power supply for the light-shielded pixel unit 1 is newly added to change the drive timing. This change makes it possible to select whether the signal components from the light-shielded pixels PIX11 to PIX13 or the reference signal level is to be output. Hence, the increase in chip area can be minimized. Furthermore, it is unnecessary to output both the output levels of the light-shielded pixels PIX11 to PIX13 and the reference signal level different from the output data of the light-shielded pixels. For this reason, the time necessary for the read on the entire screen can be shortened.

(Sixth Embodiment)

Figure 11:
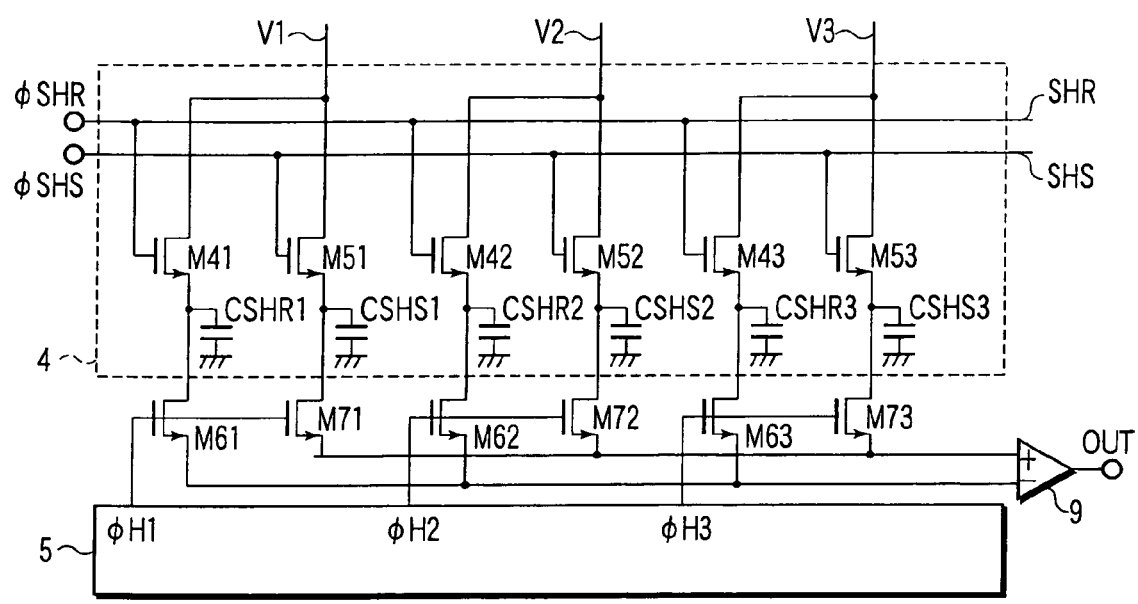
FIG. 11 is a view showing the arrangement of a solid-state image sensing apparatus according to the sixth embodiment of the present invention.

FIG. 11 shows the arrangement of a solid-state image sensing apparatus according to the sixth embodiment of the present invention. This will be described.

The same reference numerals as in the fifth embodiment (FIG. 9) denote the same constituent elements in the sixth embodiment. Different parts will mainly be described, and repetitive description will be omitted.

The solid-state image sensing apparatus according to the sixth embodiment is based on the arrangement shown in FIG. 9 but has a noise suppressing circuit 4 having a different structure. The structure of the noise suppressing circuit 4 is basically the same as in FIG. 7 except the following points.

In the above-described structure shown in FIG. 7, the gate of the photodetection switch M51 is connected to the optical signal sample control line SHS2 and driven and controlled by the optical signal sample control signal φSHS2. The gates of the photodetection switches M52 and M53 are connected to the optical signal sample control line SHS1 and driven and controlled by the optical signal sample control signal φSHS1. In the sixth embodiment, the gates of photodetection switches M51 to M53 are connected to an optical signal sample control line SHS and driven and controlled by an optical signal sample control signal φSHS. The remaining parts are the same as in FIGS. 7 and 9, and detailed description thereof will be omitted.

Figure 12A:
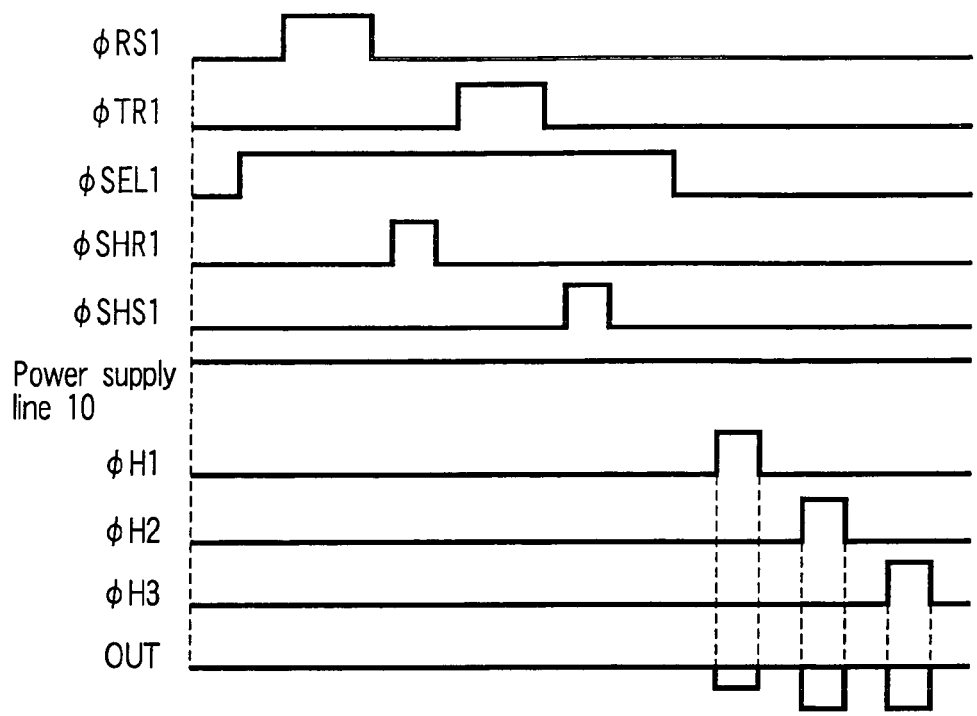
FIG. 12A is a timing chart of a read operation for an output signal from a light-shielded pixel unit 1, which is used when the incident light amount is small, in the solid-state image sensing apparatus according to the sixth embodiment.

The read operation for the output signal from a light-shielded pixel unit 1, which is used when the incident light amount is small, in the solid-state image sensing apparatus according to the sixth embodiment of the present invention will be described first with reference to the timing chart shown in FIG. 12A. A light-shielded pixel power supply line 10 and an effective pixel power supply line 7 are set to a common potential. A reset signal sample control signal φSHS is set to "H" level at the same timing as that of the reset signal sample control signal φSHS1 in FIG. 8A. In this case, the drive timing is the same as in FIG. 8A, and detailed description thereof will be omitted.

Figure 12B:
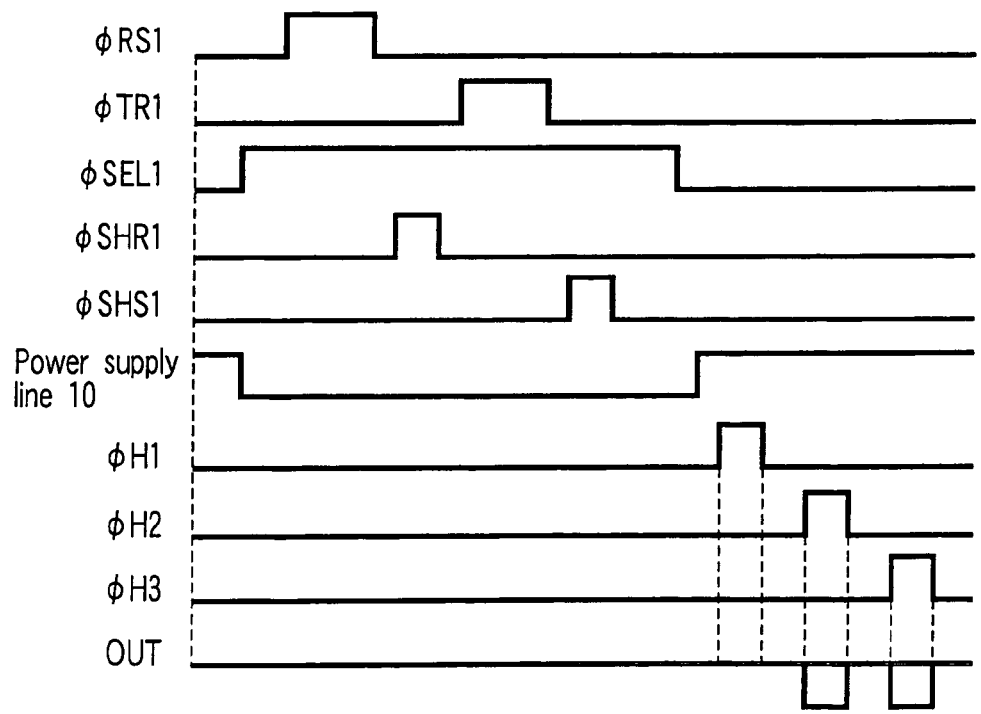
FIG. 12B is a timing chart of a read operation for a reference signal different from the output signal from the light-shielded pixel unit 1, which is used when very strong light is incident, in the solid-state image sensing apparatus according to the sixth embodiment.

The read operation for a reference signal different from the output from the light-shielded pixel unit 1, which is used when very strong light such as a spotlight or sunlight is incident, in the solid-state image sensing apparatus according to the sixth embodiment of the present invention will be described next in detail with reference to the timing chart shown in FIG. 12B. In this case, the same driving operation as in FIG. 12A (FIG. 8A) is performed except that the light-shielded pixel power supply line 10 is fixed to the GND potential.

First, a pixel output select signal φSEL1 is set to "H" level to connect amplification MOS transistors M321 and M331 to vertical signal lines V2 and V3 and current sources I42 and I43 through row select MOS transistors M421 and M431. On the other hand, a vertical signal line V1 is fixed to GND because there is no current path flowing to a pixel current source I41. Before the read of optical signal charges from photodiodes D11 to D31, a pixel reset signal φRS1 is set to "H" level to reset the gates of the amplification MOS transistors M321 and M331 to the effective pixel power supply line 7 through reset MOS transistors M221 and M231.

On the other hand, the gate potential of an amplification MOS transistor M311 is set to the GND potential. The potential is fixed to GND because the light-shielded pixel power supply line 10 is disconnected from the vertical signal line V1, and there is no current path flowing to the pixel current source I41.

Next, the pixel reset signal φRS1 is returned to "L" level to disconnect the effective pixel power supply line 7 from the gates of the amplification MOS transistors M311 to M331. Subsequently, the reset signal sample control signal φSHR is set to "H" level to store the reset signal components of the vertical signal lines V2 and V3 in reset signal capacitors CSHR2 and CSHR3 through reset signal switches M42 and M43 and the GND component of the vertical signal line V1 in a reset signal capacitor CSHR1 through a reset signal switch M41. After the end of storage in the reset signal capacitors CSHR1 to CSHR3, the reset signal sample control signal φSHR is returned to "L" level to cause the reset signal capacitors CSHR2 and CSHR3 to hold the stored reset signal components and the reset signal capacitor CSHR to hold the GND component.

After that, a PD signal transfer signal φTR1 is set to "H" level to transfer the optical signal charges in the photodiodes D21 and D31 to the gates of the amplification MOS transistors M321 and M331 through transfer MOS transistors M121 and M131.

On the other hand, the optical signal charges in the photodiode D11 cannot be transferred because the gate potential of the amplification MOS transistor M311 is GND. The potential remains almost GND.

After the end of transfer, the PD signal transfer signal φTR1 is returned to "L" level to disconnect the photodiodes D11 to D31 from the gates of the amplification MOS transistors M311 to M331. Subsequently, the optical signal sample control signal φSHS is set to "H" level to store the optical signal components of the vertical signal lines V2 and V3 in optical signal capacitors CSHS2 and CSHS3 through optical signal switches M52 and M53 and the GND component of the vertical signal line V1 in an optical signal capacitor CSHS1 through an optical signal switch M51. After the end of storage in the optical signal capacitors CSHS1 to CSHS3, the optical signal sample control signal φSHS is returned to "L" level to cause the optical signal capacitors CSHS2 and CSHS3 to hold the stored optical signal components and the optical signal capacitor CSHS1 to hold the GND component. Finally, column select signals φH1 to φH3 from a horizontal scanning circuit 5 are sequentially set to "H" level. Accordingly, the voltages held in the reset signal capacitors CSHR1 to CSHR3 and optical signal capacitors CSHS1 to CSHS3 are read out to a differential circuit 9 through horizontal select switches M61 to M63 and M71 to M73.

The differential circuit 9 obtains the difference between each reset signal component and a corresponding optical signal component and sequentially outputs the difference to a sensor output line OUT.

The read of the pixel cells connected to the first row is thus completed. At this time, both the reset signal capacitor CSHR1 and the optical signal capacitor CSHS1 hold the GND component. For this reason, the output from the differential circuit 9 is zero.

The signal output levels of effective pixels PIX21 and PIX31 are corrected on the basis of the zero output from the differential circuit 9. In the same way as described above, the signals of the pixel cells connected to the second and subsequent rows are sequentially read out in accordance with signals from a vertical scanning circuit 3 so that the read of all pixel cells is ended.

As described above, in the sixth embodiment, when very strong light such a as spotlight or sunlight is incident, a reference signal level different from the signal components of light-shielded pixels PIX11 to PIX13 is output. With this arrangement, an image which is not influenced by a black level variation observed in the light-shielded pixels PIX11 to PIX13 can be obtained. In addition, one control line for the noise suppressing circuit 4 is added to change the drive timing. This change makes it possible to select whether the signal components from the light-shielded pixels PIX11 to PIX13 or the reference signal level is to be output. Hence, the increase in chip area can be minimized. Furthermore, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened. In addition, any degradation in characteristic due to power supply noise, GND noise, and the like can be suppressed by executing differential processing.

(Seventh Embodiment)

A solid-state image sensing apparatus according to the seventh embodiment of the present invention has the same arrangement as in FIG. 1 described above. The same reference numerals as in FIG. 1 denote the same constituent elements in the seventh embodiment, and different operations will mainly be described below by appropriately referring to FIG. 1.

FIG. 13A is a timing chart showing the read operation for an output signal from a light-shielded pixel unit 1, which is used when the incident light amount is small, in the solid-state image sensing apparatus according to the seventh embodiment of the present invention. The drive timing is the same as in FIG. 2A, and repetitive description will be omitted.

The read operation for a reference signal different from the output from the light-shielded pixel unit 1, which is used when very strong light such as a spotlight or sunlight is incident, in the solid-state image sensing apparatus according to the seventh embodiment of the present invention will be described next in detail with reference to the timing chart shown in FIG. 13B. The operation until CDS1 to CDS3 of a noise suppressing circuit 4 are caused to hold the pixel signal components of a light-shielded pixel PIX11 and effective pixels PIX21 and PIX31 is the same as in FIG. 13A (FIG. 2A). After that, a horizontal scanning circuit 5 fixes a column select signal φH1 to "L" level and sequentially sets column select signals φH2 and φH3 to "H" level. Accordingly, the reset level of an output amplifier 6, and subsequently, the pixel signal components of the effective pixels PIX21 and PIX31, which are stored in the noise suppressing circuit 4, are read out through horizontal select switches M32 and M33 in the time-series order and output through the output amplifier 6. At this time, in the seventh embodiment, the signal output levels of the effective pixels PIX21 and PIX31 are corrected on the basis of the reset level of the output amplifier 6, which is different from the pixel signal component of the light-shielded pixel PIX11.

As described above, in the seventh embodiment, when very strong light such as a spotlight or sunlight is incident, a reference signal component different from the signal components of the light-shielded pixels PIX11 to PIX13 is output. With this arrangement, an image which is not influenced by a black level variation observed in the light-shielded pixels PIX11 to PIX13 can be obtained. In addition, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened.

(Eighth Embodiment)

The arrangement of a solid-state image sensing apparatus according to the eighth embodiment of the present invention is different from FIG. 9 described above in that a single power supply line 7 is commonly used as a light-shielded pixel power supply line 10 which supplies a power to a light-shielded pixel unit 1 and an effective pixel power supply line 7 which supplies power to an effective pixel unit 2. The remaining parts are the same as in FIG. 9. The same reference numerals as in FIG. 9 denote the same constituent elements in the eighth embodiment, and different operations will mainly be described below by appropriately referring to FIG. 9.

Figure 14A:
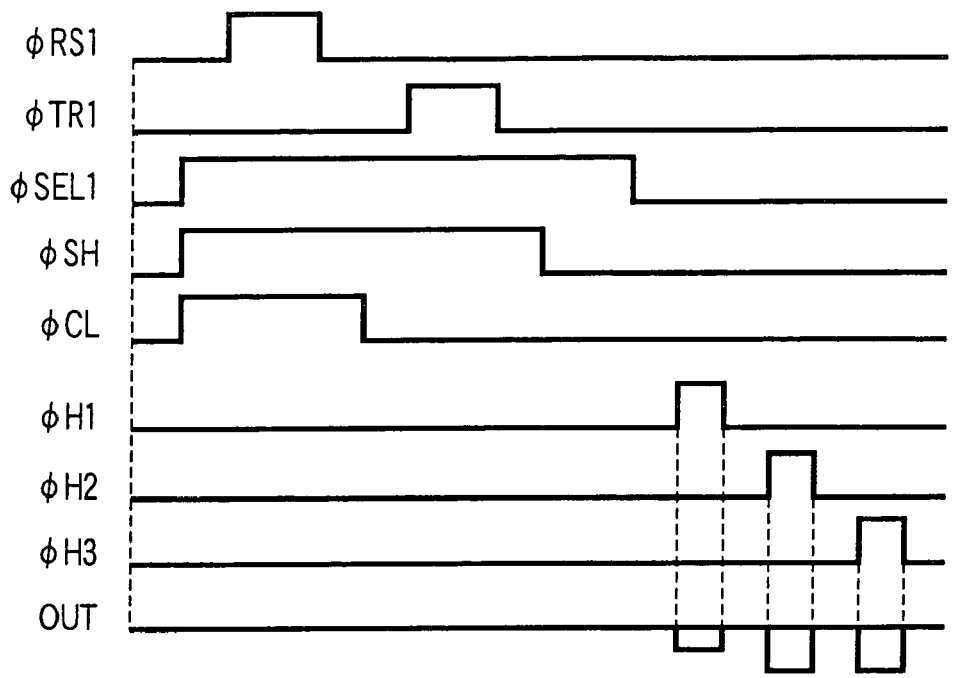
FIG. 14A is a timing chart of a read operation for an output signal from a light-shielded pixel unit 1, which is used when the incident light amount is small, in the solid-state image sensing apparatus according to the eighth embodiment.

FIG. 14A is a timing chart showing the read operation for the output signal from the light-shielded pixel unit 1, which is used when the incident light amount is small, in the solid-state image sensing apparatus according to the eighth embodiment of the present invention. The clamp control signal φCL is set to "H" level at the same timing as that of the clamp control signal φCL1 in FIG. 4A. In this case, the drive timing is the same as in FIG. 4A, and repetitive description will be omitted.

Figure 14B:
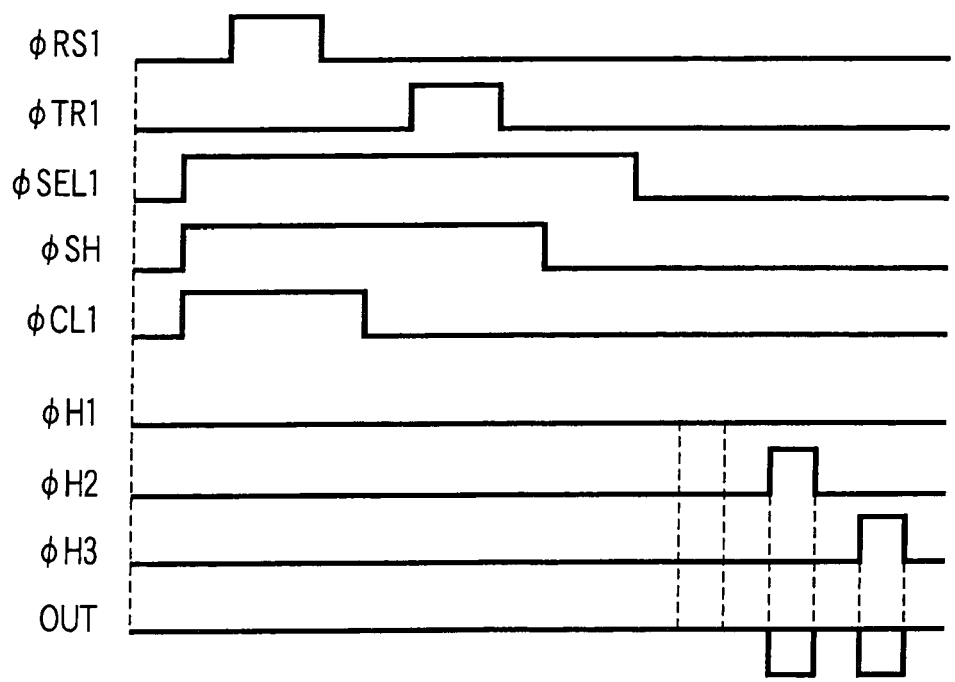
FIG. 14B is a timing chart of a read operation for a reference signal different from the output signal from the light-shielded pixel unit 1, which is used when very strong light is incident, in the solid-state image sensing apparatus according to the eighth embodiment.

The read operation for a reference signal different from the output from the light-shielded pixel unit 1, which is used when very strong light such as a spotlight or sunlight is incident, in the solid-state image sensing apparatus according to the eighth embodiment of the present invention will be described next in detail with reference to the timing chart shown in FIG. 14B. The operation until optical signal components are stored in sample-and-hold capacitors CSH1 to CSH3 is the same as in FIG. 13A (FIG. 4A). After that, a horizontal scanning circuit 5 fixes a column select signal φH1 to "L" level and sequentially sets column select signals φH2 and φH3 to "H" level. Accordingly, the reset level of an output amplifier 6, and subsequently, the pixel signal components of effective pixels PIX21 and PIX31, which are stored in a noise suppressing circuit 4, are read out through horizontal select switches M32 and M33 in the time-series order and output through the output amplifier 6. At this time, the signal output levels of the effective pixels PIX21 and PIX31 are corrected on the basis of the reset level of the output amplifier 6, which is different from the pixel signal component of a light-shielded pixel PIX11. In the same way as described above, the signals of the pixel cells connected to the second and subsequent rows are sequentially read out in accordance with row select signals from a vertical scanning circuit 3 so that the read of all pixel cells is ended.

As described above, in the eighth embodiment, when very strong light such as a spotlight or sunlight is incident, a reference signal level different from the signal components of light-shielded pixels PIX11 to PIX13 is output. With this arrangement, an image which is not influenced by a black level variation observed in the light-shielded pixels PIX11 to PIX13 can be obtained. In addition, the drive timing of the horizontal scanning circuit 5 is changed. This change makes it possible to select whether the signal components from the light-shielded pixels PIX11 to PIX13 or the reference signal level is to be output. Hence, the chip area does not increase. Furthermore, it is unnecessary to output both the output levels of the light-shielded pixels PIX11 to PIX13 and the reference signal level different from the output data of the light-shielded pixels. For this reason, the time necessary for the read on the entire screen can be shortened.

(Ninth Embodiment)

The arrangement of a solid-state image sensing apparatus according to the ninth embodiment of the present invention is different from that shown in FIG. 7 described above in that the gate of an optical signal switch M51 is connected to an optical signal sample control signal φSHS1. The remaining parts are the same as in FIG. 7. The same reference numerals as in FIG. 7 denote the same constituent elements in the ninth embodiment, and different operations will mainly be described below by appropriately referring to FIG. 7.

FIG. 15A is a timing chart showing the read operation for the output signal from a light-shielded pixel unit 1, which is used when the incident light amount is small, in the solid-state image sensing apparatus according to the ninth embodiment of the present invention. A reset signal sample control signal φSHR is set to "H" level at the same timing as that of the reset signal sample control signal φSHR1 in FIG. 8A. In this case, the drive timing is the same as in FIG. 8A, and repetitive description will be omitted.

The read operation for a reference signal different from the output from the light-shielded pixel unit 1, which is used when very strong light such as a spotlight or sunlight is incident, in the solid-state image sensing apparatus according to the ninth embodiment of the present invention will be described next in detail with reference to the timing chart shown in FIG. 15B. The operation until reset signal components are stored in reset signal capacitors CSHR1 to CSHR3 and optical signal components are stored in optical signal capacitors CSHS1 to CSHS3 is the same as in FIG. 15A (FIG. 8A).

After that, a horizontal scanning circuit 5 fixes a column select signal φH1 to "L" level and sequentially sets column select signals φH2 and φH3 to "H" level. Accordingly, the reset level of a differential circuit 9, and subsequently, the voltages held in the reset signal capacitors CSHR2 and CSHR3 and optical signal capacitors CSHS2 and CSHS3 of a noise suppressing circuit 4 are read out to the differential circuit 9 through horizontal select switches M62 and M63 and M72 and M73. The differential circuit 9 obtains the difference between each reset signal component and a corresponding optical signal component and sequentially outputs the difference to a sensor output line OUT. The read of the pixel cells connected to the first row is thus completed. In the ninth embodiment, the signal output levels of effective pixels PIX21 and PIX31 are corrected on the basis of the reset level of the differential circuit 9.

In the same way as described above, the signals of the pixel cells connected to the second and subsequent rows are sequentially read out in accordance with signals from a vertical scanning circuit 3 so that the read of all pixel cells is ended.

As described above, in the ninth embodiment, when very strong light such as a spotlight or sunlight is incident, a reference signal level different from the signal components of light-shielded pixels PIX11 to PIX13 is output. With this arrangement, an image which is not influenced by a black level variation observed in the light-shielded pixels PIX11 to PIX13 can be obtained. In addition, the drive timing of the horizontal scanning circuit 5 is changed. This change makes it possible to select whether the signal components from the light-shielded pixels PIX11 to PIX13 or the reference signal level is to be output. Hence, the chip area does not increase. Furthermore, it is unnecessary to output both the output levels of the light-shielded pixels PIX11 to PIX13 and the reference signal level different from the output data of the light-shielded pixels PIX11 to PIX13. For this reason, the time necessary for the read on the entire screen can be shortened. In addition, any degradation in characteristic due to power supply noise, GND noise, and the like can be suppressed by executing differential processing.

The relationship between appended claims and the above-described first to ninth embodiments is as follows. An effective signal photoelectric conversion unit in claims corresponds to the effective pixel unit 2. A reference signal photoelectric conversion unit corresponds to the light-shielded pixel unit 1. A noise suppressing unit corresponds to the noise suppressing circuit 4. A switch unit corresponds to the clamp switch. A first power supply line corresponds to the pixel power supply line 7. A second power supply line corresponds to a light-shielded pixel power supply line 10.

(10th Embodiment)

The 10th embodiment in which one of the solid-state image sensing apparatuses according to the above-described first to ninth embodiments is applied to a camera will be described below in detail.

Figure 16:
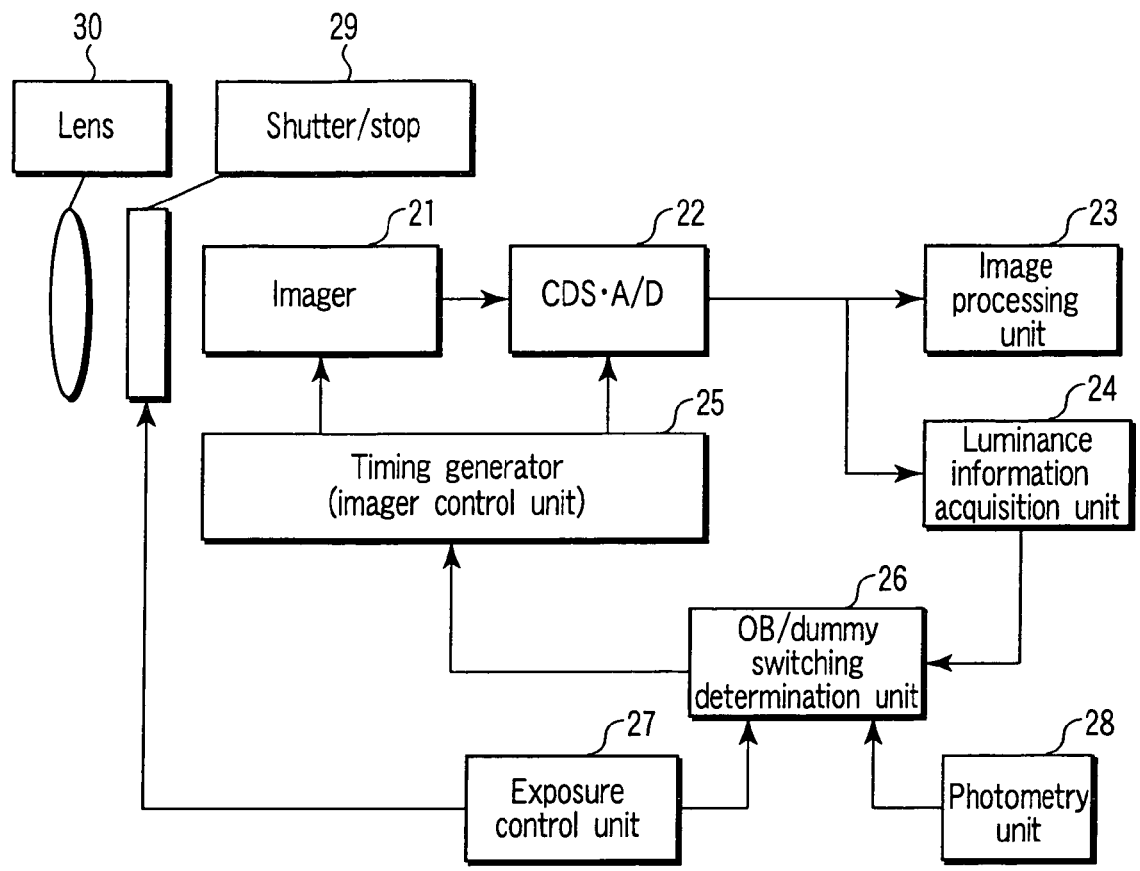
FIG. 16 is a block diagram showing the arrangement of a camera according to the 10th embodiment of the present invention.

FIG. 16 is a block diagram showing the arrangement of the camera according to the 10th embodiment of the present invention.

As shown in FIG. 16, a photographing lens 30 and shutter/stop 29 are arranged on the optical path of object light. An imager 21 is arranged on the imaging plane of light that has passed through the shutter/stop 29. The imager 21 corresponds to the solid-state image sensing apparatus according to one of the above-described first to ninth embodiments.

The output from the imager 21 is connected to the inputs of an image processing unit 23 and luminance information acquisition unit 24 through a CDS·A/D 22. The output from the luminance information acquisition unit 24 is connected to the input of a timing generator (imager control unit) 25 through an OB/dummy switching determination unit 26 such as a CPU.

Outputs from the timing generator 25 are connected to the inputs of the imager 21 and CDS·A/D 22. In addition, the output from an exposure control unit 27 and that from a photometry unit 28 are connected to the inputs of the OB/dummy switching determination unit 26.

A determination unit in claims corresponds to the OB/dummy switching determination unit 26.

In this arrangement, the shutter/stop 29 is driven and controlled by the exposure control unit 27. An analog video signal is output from the imager 21 exposed through the photographing lens 30 and shutter/stop 29 to the CDS·A/D 22.

Figure 17:
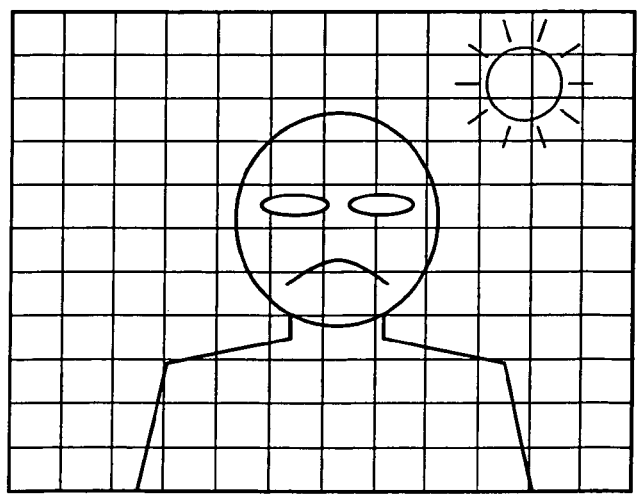
FIG. 17 is a view showing an erect object image.

The analog video signal contains a light-receiving pixel signal and a light-shielded pixel signal or reference signal level. The analog video signal is digitized by correlated double sampling and analog-to-digitized conversion by the CDS·A/D 22. At this time, the black level is fed back and clamped in the camera by using the light-shielded pixel signal or reference signal level selectively output from the imager 21. The output signal from the CDS·A/D 22 is subjected to 3-CCD processing, spatial frequency band correction, and YCC processing by the image processing unit 23 and output to a recording medium or monitor (not shown). The output signal from the CDS·A/D 22 is also input to the luminance information acquisition unit 24. The luminance information acquisition unit 24 generates an evaluation value of luminance information and inputs it to the OB/dummy switching determination unit 26. The evaluation value of luminance information is obtained in the following way. For example, on an erect object image shown in FIG. 17, luminance level equivalent signals are added and averaged for each divided area. The maximum value of the obtained values is used as the evaluation value. Shutter speed information and stop information in exposure control are input from the exposure control unit 27 to the OB/dummy switching determination unit 26. Object luminance information is also input to the OB/dummy switching determination unit 26 from the photometry unit 28 which measures the luminance of the object (not shown). The imager 21 receives a driving pulse and a control signal necessary for switching of light-shielded pixel signal/reference signal from the timing generator 25. A signal representing the timing of sampling the analog video signal and a signal representing the black level clamp operation period are input from the timing generator 25 to the CDS·A/D 22. The OB/dummy switching determination unit 26 sends an instruction signal for an operation mode including switching of light-shielded pixel signal/reference signal.

Figure 18:
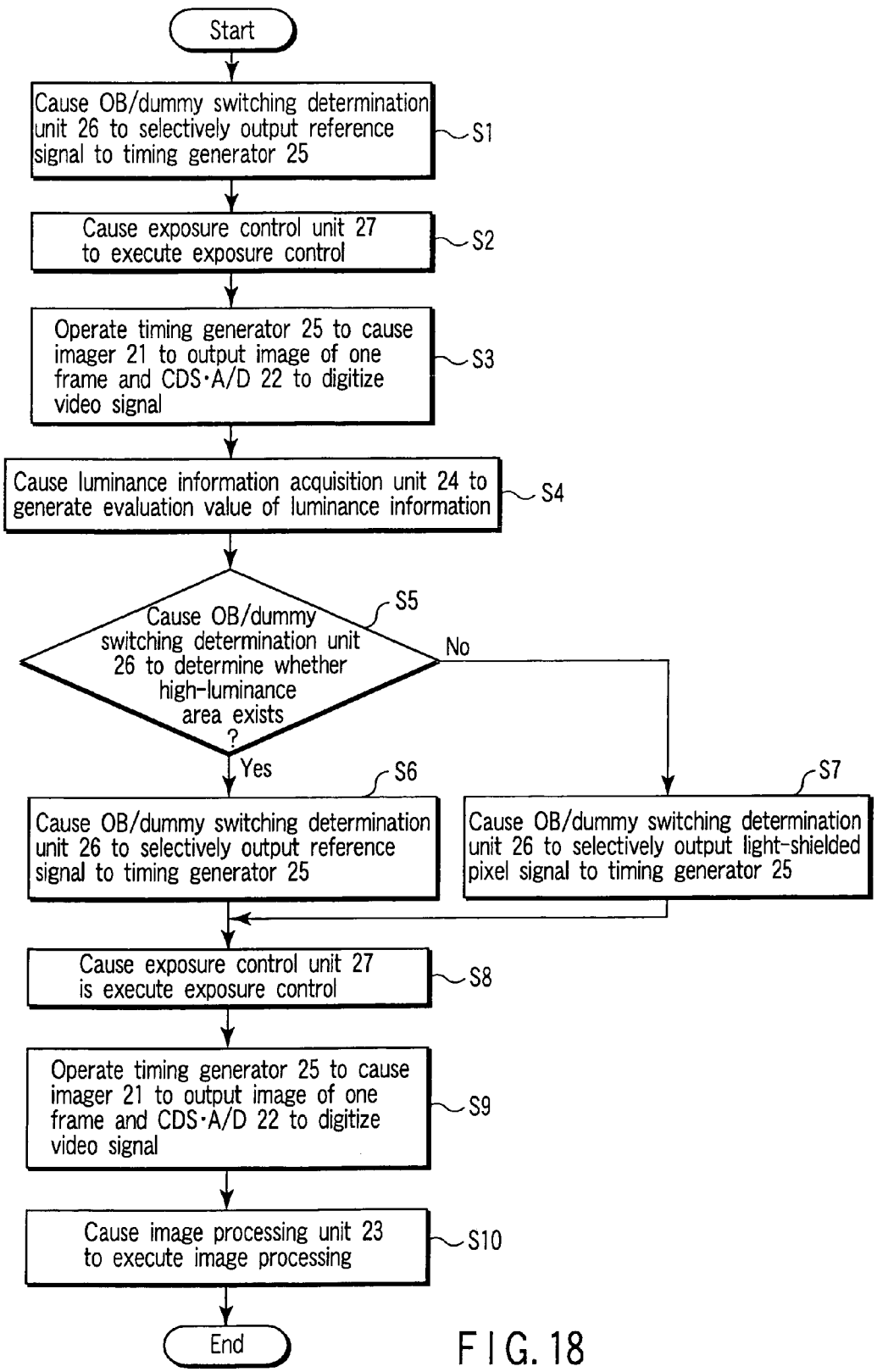
FIG. 18 is a flowchart for explaining details of the first operation example of the camera according to the 10th embodiment of the present invention.

The first operation example of the camera according to the 10th embodiment of the present invention will be described below in detail with reference to the flowchart shown in FIG. 18.

When the first operation starts, the reference signal (instruction signal) is selectively output from the OB/dummy switching determination unit 26 to the timing generator 25 (step S1). The exposure control unit 27 executes exposure control (step S2). The timing generator 25 is operated to cause the imager 21 to output an analog video signal of one frame. The CDS·A/D 22 digitizes the analog video signal (step S3). The luminance information acquisition unit 24 generates an evaluation value of luminance information in the above-described way (step S4). The OB/dummy switching determination unit 26 determines in the above-described way whether a high-luminance area exists (step S5). If YES in step S5, the reference signal is selectively output from the OB/dummy switching determination unit 26 to the timing generator 25 (step S6). If NO in step S5, the light-shielded pixel signal is selectively output from the OB/dummy switching determination unit 26 to the timing generator 25 (step S7). The exposure control unit 27 executes exposure control (step S8). The timing generator 25 is operated to cause the imager 21 to output an analog video signal of one frame. The CDS·A/D 22 digitizes the video signal (step S9). The image processing unit 23 executes image processing (step S10). The above operation is executed for each frame.

The first operation is thus ended.

Figure 19:
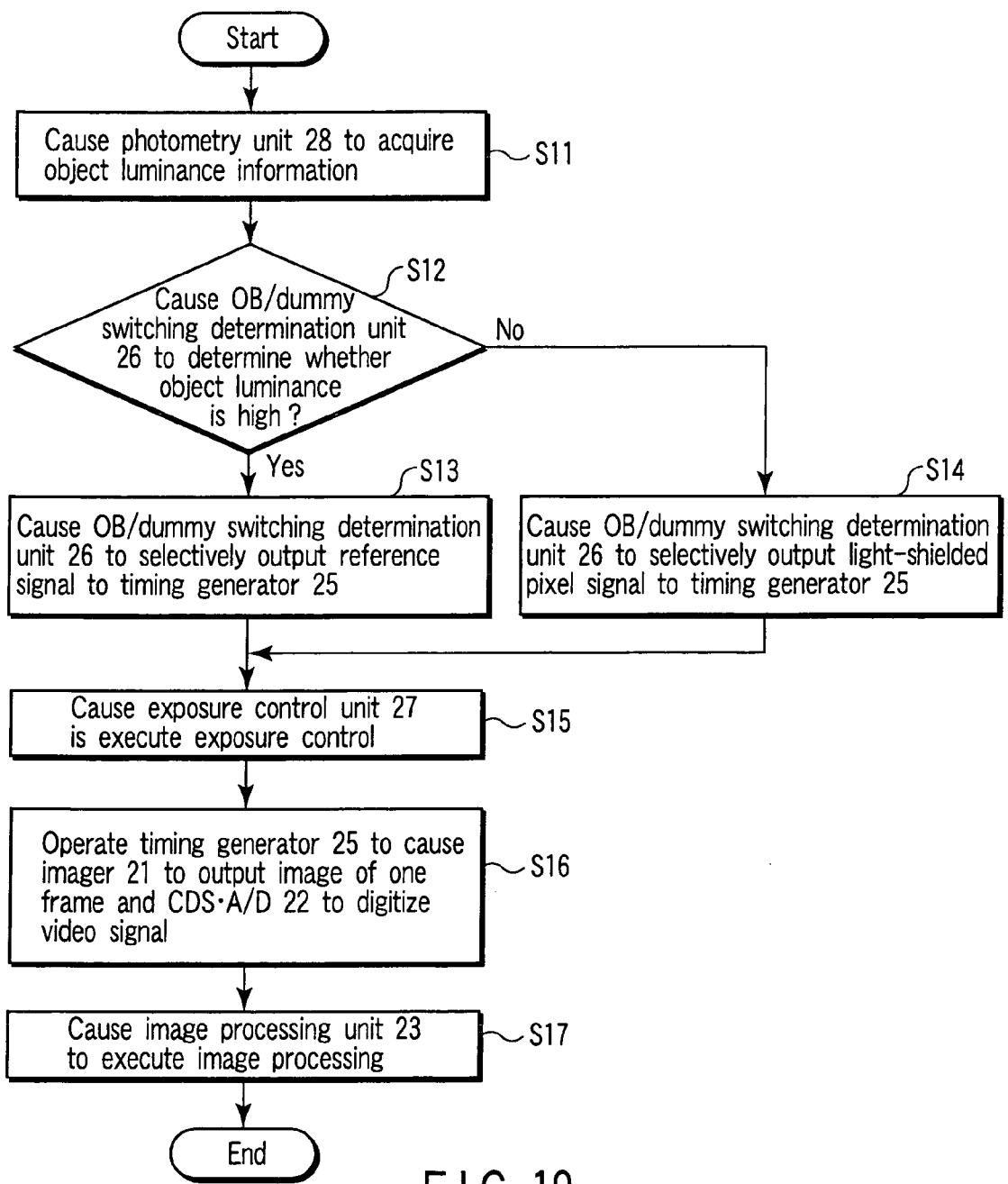
FIG. 19 is a flowchart for explaining details of the second operation example of the camera according to the 10th embodiment of the present invention.

The second operation example of the camera according to the 10th embodiment of the present invention will be described next in detail with reference to the flowchart shown in FIG. 19.

When the second operation starts, the photometry unit 28 acquires object luminance information on the basis of a photographing instruction from an operation unit (not shown) (step S11). The OB/dummy switching determination unit 26 determines whether a high-luminance area exists (step S12).

If YES in step S12, the reference signal is selectively output from the OB/dummy switching determination unit 26 to the timing generator 25 (step S13). If NO in step S12, the light-shielded pixel signal is selectively output from the OB/dummy switching determination unit 26 to the timing generator 25 (step S14).

The exposure control unit 27 executes exposure control (step S15). The timing generator 25 is operated to cause the imager 21 to output a video signal of one frame. The CDS·A/D 22 digitizes the video signal (step S16). The image processing unit 23 executes image processing (step S17). The above operation is executed for each frame. The second operation is thus ended.

As described above, in the 10th embodiment, when very strong light such as a spotlight or sunlight is incident, a reference signal different from a light-shielded pixel signal is output. With this arrangement, an image which is not influenced by a black level variation observed in the light-shielded pixels can be obtained. In addition, the time necessary for the read on the entire screen can be shortened. Furthermore, any degradation in characteristic due to power supply noise or GND noise can be suppressed by executing differential processing. In addition, satisfactory video signal processing and iris control are implemented.

The first to tenth embodiments of the present invention have been described above. The present invention is not limited to these embodiments, and various changes and modifications can be made without departing from the spirit and scope of the present invention. For example, a plurality of light-shielded pixel units may be arranged in a plurality of rows. In this case, since the influence of fixed pattern noise can further be reduced, the reliability of the reference signal level for correction further increases.

According to the present invention, a solid-state image sensing apparatus which can appropriately correct the black level of a video signal even when a high-luminance state or spotlight exists can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solid-state image sensing apparatus comprising:
an effective signal photoelectric conversion unit to receive object light;
a light-shielded reference signal photoelectric conversion unit to output an optical black level equivalent signal; and
a noise suppressing circuit which suppresses a reset variation for each pixel,
wherein in addition to an output from the effective signal photoelectric conversion unit, one of an output from the reference signal photoelectric conversion unit and a predetermined reference voltage is selectively output, and
wherein switching between the predetermined reference voltage and the output from the reference signal photoelectric conversion unit is done by changing a driving signal of the noise suppressing circuit.

2. A solid-state image sensing apparatus according to claim 1, wherein the predetermined reference voltage is a voltage to be applied to the reference signal photoelectric conversion unit.

3. A solid-state image sensing apparatus according to claim 1, wherein the noise suppressing circuit includes a switch unit which switches at least between the predetermined reference voltage and the output from the reference signal photoelectric conversion unit, and
in which whether an output signal from the reference signal photoelectric conversion unit can be read out and be selected.

4. A solid-state image sensing apparatus comprising:
an effective signal photoelectric conversion unit to receive object light;
a light-shielded reference signal photoelectric conversion unit to output an optical black level equivalent signal; and
a noise suppressing circuit which suppresses a reset variation for each pixel,
wherein in addition to an output from the effective signal photoelectric conversion unit, one of an output from the reference signal photoelectric conversion unit and a predetermined reference voltage is selectively output,
wherein the noise suppressing circuit has at least a clamp capacitor, a sample-and-hold switch, a clamp switch, and a sample-and-hold capacitor, which are connected to each of vertical signal lines extending from the effective signal photoelectric conversion unit and the reference signal photoelectric conversion unit, and
in which one of the output from the reference signal photoelectric conversion unit and the predetermined reference voltage is held in the sample-and-hold capacitor for the reference signal photoelectric conversion unit and output by driving and controlling the sample-and-hold switch and the clamp switch of the vertical signal lines extending from the reference signal photoelectric conversion unit.

5. A solid-state image sensing apparatus comprising:
an effective signal photoelectric conversion unit to receive object light;
a light-shielded reference signal photoelectric conversion unit to output an optical black level equivalent signal; and
a noise suppressing circuit which suppresses a reset variation for each pixel,
wherein in addition to an output from the effective signal photoelectric conversion unit, one of an output from the reference signal photoelectric conversion unit and a predetermined reference voltage is selectively output,
wherein the noise suppressing circuit has at least a reset signal capacitor, a reset signal switch, an optical signal capacitor, and an optical signal switch, which are connected to each of vertical signal lines extending from the effective signal photoelectric conversion unit and the reference signal photoelectric conversion unit, and
in which in a predetermined case, both of the reset signal capacitor and the optical signal capacitor are caused to hold reset signal components and output the reset signal components by driving and controlling the reset signal switch and the optical signal switch.

6. A solid-state image sensing apparatus according to claim 5, wherein the predetermined case is a case in which an incident light amount of the object light is large.

7. A solid-state image sensing apparatus comprising:
an effective signal photoelectric conversion unit to receive object light;
a light-shielded reference signal photoelectric conversion unit to output an optical black level equivalent signal; and
a noise suppressing circuit which suppresses a reset variation for each pixel,
wherein in addition to an output from the effective signal photoelectric conversion unit, one of an output from the reference signal photoelectric conversion unit and a predetermined reference voltage is selectively output,
wherein the noise suppressing circuit has at least a capacitor connected to each of vertical signal lines extending from the effective signal photoelectric conversion unit and the reference signal photoelectric conversion unit,
a first power supply line which supplies a power to the effective signal photoelectric conversion unit, and
a second power supply line which supplies a power to the reference signal photoelectric conversion unit, and
in which in a predetermined case, a potential of a vertical signal line extending from the reference signal photoelectric conversion unit is fixed to GND by the second power supply line, and the predetermined reference voltage is held in the capacitor extending from the reference signal photoelectric conversion unit and output.

8. A solid-state image sensing apparatus according to claim 7, wherein the predetermined case is a case in which an incident light amount of the object light is large.

9. A solid-state image sensing apparatus comprising:
an effective signal photoelectric conversion unit to receive object light;
a light-shielded reference signal photoelectric conversion unit to output an optical black level equivalent signal; and
a noise suppressing circuit which suppresses a reset variation for each pixel,
wherein in addition to an output from the effective signal photoelectric conversion unit, one of an output from the reference signal photoelectric conversion unit and a predetermined reference voltage is selectively output,
which further comprises an output amplifier which amplifies an output from the noise suppressing circuit, and
in which a signal output level of the effective signal photoelectric conversion unit is corrected selectively on the basis of one of a pixel signal component of the reference signal photoelectric conversion unit and a reset level of the output amplifier, which is different from the signal component.

* * * * *